United States Patent
Lee et al.

(10) Patent No.: US 12,068,350 B2
(45) Date of Patent: Aug. 20, 2024

(54) COMPLEMENTARY METAL-OXIDE SEMICONDUCTOR (CMOS) IMAGE SENSOR

(71) Applicant: SAMSUNG ELECTRONICS CO., LTD., Suwon-si (KR)

(72) Inventors: Seokha Lee, Hwaseong-si (KR); Junetaeg Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 518 days.

(21) Appl. No.: 17/382,777

(22) Filed: Jul. 22, 2021

(65) Prior Publication Data

US 2022/0181376 A1   Jun. 9, 2022

(30) Foreign Application Priority Data

Dec. 4, 2020 (KR) .................. 10-2020-0168937

(51) Int. Cl.
*H01L 27/146* (2006.01)
*H01L 25/065* (2023.01)

(52) U.S. Cl.
CPC .. *H01L 27/14636* (2013.01); *H01L 27/14634* (2013.01); *H01L 25/0657* (2013.01); *H01L 27/1463* (2013.01)

(58) Field of Classification Search
CPC ......... H01L 27/14636; H01L 27/14634; H01L 27/1463; H01L 27/14623; H01L 21/76898
See application file for complete search history.

(56) References Cited

U.S. PATENT DOCUMENTS

| | | | |
|---|---|---|---|
| 9,136,163 B2 | 9/2015 | Kumano | |
| 9,142,581 B2 | 9/2015 | Qian et al. | |
| 9,728,572 B2 | 8/2017 | Park et al. | |
| 10,490,677 B2 * | 11/2019 | Mizuta | H01L 27/14645 |
| 10,629,643 B2 | 4/2020 | Kim et al. | |
| 10,672,823 B2 | 6/2020 | Shin et al. | |
| 2010/0109006 A1 * | 5/2010 | Kobayashi | H01L 27/14636 257/776 |
| 2017/0040374 A1 * | 2/2017 | Oh | H01L 21/187 |
| 2019/0189502 A1 * | 6/2019 | Kim | H01L 21/76804 |
| 2020/0058549 A1 * | 2/2020 | Choi | H10K 39/32 |

(Continued)

*Primary Examiner* — Georgia Y Epps
*Assistant Examiner* — Erin R Garber
(74) *Attorney, Agent, or Firm* — Sughrue Mion, PLLC

(57) ABSTRACT

Provided is an image sensor including a sensor chip including a first substrate and a first interconnection layer, a logic chip including a second substrate and a second interconnection layer, a through-hole penetrating a portion of the second interconnection layer, the first substrate, and the first interconnection layer, and a first connection structure disposed on an inner surface of the through-hole and extending from the first substrate toward the second interconnection layer, wherein the first interconnection layer includes a first interlayer insulating layer and a first interconnection pattern, the second interconnection layer includes a second interlayer insulating layer and a second interconnection pattern, the through-hole includes first and second trenches respectively extending from the through-hole toward the second interconnection layer, bottom surfaces of the first and second trenches contact the second interconnection pattern, and a bottom surface of the through-hole contacts the first interconnection pattern.

18 Claims, 18 Drawing Sheets

(56) References Cited

U.S. PATENT DOCUMENTS

2020/0105836 A1    4/2020  Kim et al.
2020/0127032 A1    4/2020  Ogino et al.
2020/0294970 A1*  9/2020  Uh .......................... H01L 24/11

* cited by examiner

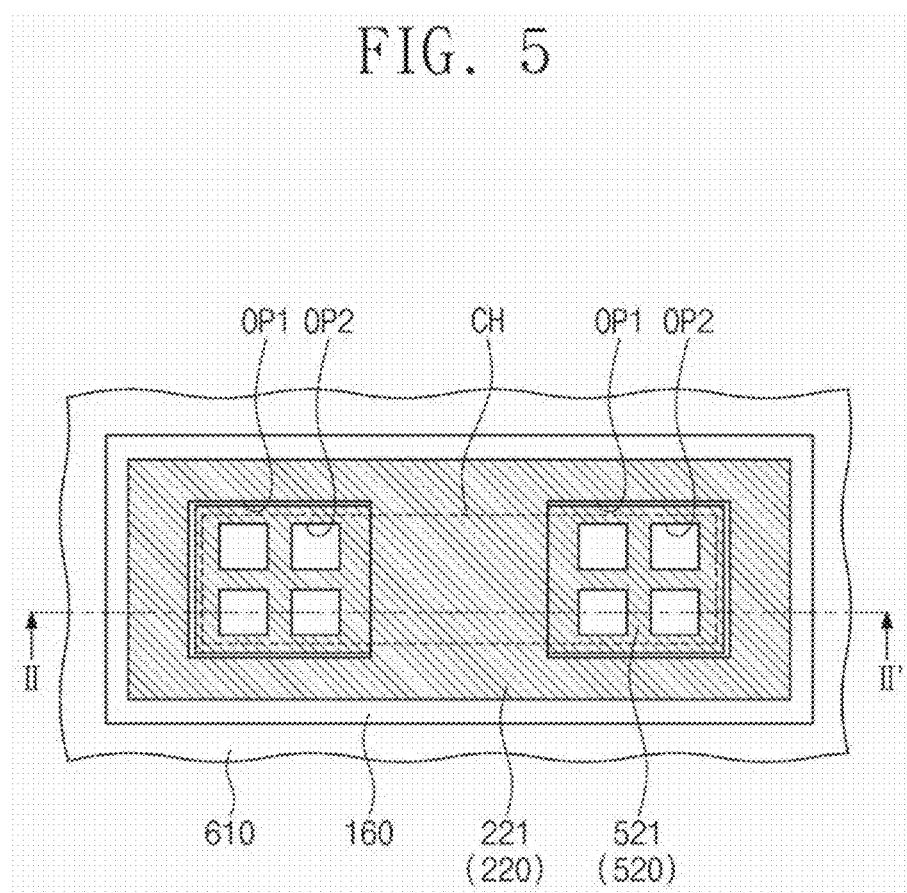

COMPLEMENTARY METAL-OXIDE SEMICONDUCTOR (CMOS) IMAGE SENSOR

CROSS-REFERENCE TO THE RELATED APPLICATION

This U.S. non-provisional patent application claims priority to Korean Patent Application No. 10-2020-0168937, filed on Dec. 4, 2020, in the Korean Intellectual Property Office, the disclosure of which is hereby incorporated by reference in its entirety.

BACKGROUND

1. Field

Example embodiments of the present disclosure relate to an image sensor and a method of manufacturing the same, and more particularly, to a complementary metal-oxide-semiconductor (CMOS) image sensor and a method of manufacturing the same.

2. Description of Related Art

Image sensors are semiconductor devices for converting optical images into electrical signals. As computer and communication industries have been developed, high-performance image sensors have been increasingly demanded in various fields such as a digital camera, a camcorder, a personal communication system (PCS), a game console, a security camera, and a medical micro camera. Image sensors are categorized as any one of charge coupled device (CCD) image sensors and complementary metal-oxide-semiconductor (CMOS) image sensors. CIS is short for the CMOS image sensor. The CIS may include a plurality of pixels two-dimensionally arranged. Each of the pixels may include a photodiode (PD). The photodiode may convert incident light into an electrical signal. The plurality of pixels may be defined by a deep device isolation pattern disposed therebetween.

SUMMARY

One or more example embodiments provide an image sensor capable of minimizing or preventing connection failure.

According to an aspect of an example embodiment, there is provided an image sensor including a sensor chip including a first substrate and a first interconnection layer, the first substrate including a first surface and a second surface opposite to the first surface, and the first interconnection layer being disposed on the first surface of the first substrate, a logic chip including a second substrate and a second interconnection layer, the second interconnection layer being disposed between the first interconnection layer and the second substrate, a through-hole penetrating a portion of the second interconnection layer, the first substrate, and the first interconnection layer, and a first connection structure disposed on an inner surface of the through-hole and extending from the first substrate toward the second interconnection layer, wherein the first interconnection layer includes a first interlayer insulating layer and a first interconnection pattern disposed on the first interlayer insulating layer, wherein the second interconnection layer includes a second interlayer insulating layer and a second interconnection pattern disposed on the second interlayer insulating layer, wherein the through-hole includes a first trench and a second trench, the first trench and the second trench respectively extending from a bottom surface of two end portions of the through-hole toward the second interconnection layer, wherein a bottom surface of the first trench and a bottom surface of the second trench are in contact with the second interconnection pattern, and wherein a bottom surface of the through-hole between the first trench and the second trench is in contact with the first interconnection pattern.

According to another aspect of an example embodiment, there is provided an image sensor including a sensor chip including a first substrate and a first interconnection layer, the first substrate including a first surface and a second surface opposite to the first surface, and the first interconnection layer being disposed on the first surface of the first substrate, a logic chip including a second substrate and a second interconnection layer, the second interconnection layer disposed between the first interconnection layer and the second substrate, a through-hole penetrating a portion of the second interconnection layer, the first substrate, and the first interconnection layer, and a first connection structure disposed on an inner surface of the through-hole and extending from the first substrate toward the second interconnection layer, wherein the first interconnection layer includes a first interlayer insulating layer and a first interconnection pattern disposed on the first interlayer insulating layer, wherein the second interconnection layer includes a second interlayer insulating layer and a second interconnection pattern disposed on the second interlayer insulating layer, wherein the through-hole includes a first trench and a second trench which respectively extend from a bottom surface of the through-hole toward the second interconnection layer, wherein a bottom surface of the first trench and a bottom surface of the second trench are disposed at substantially the same level, wherein the bottom surface of the through-hole between the first trench and the second trench is disposed at a higher level than the bottom surface of the first trench, wherein the bottom surface of the first trench and the bottom surface of the second trench are in contact with the second interconnection pattern, and wherein the first interconnection pattern is disposed between an outer sidewall of the first trench and an outer sidewall of the second trench.

According to another aspect of an example embodiment, there is provided an image sensor including a sensor chip including a first substrate and a first interconnection layer, the first substrate including a first surface and a second surface opposite to the first surface, and the first interconnection layer being disposed on the first surface of the first substrate, a logic chip including a second substrate and a second interconnection layer, the second interconnection layer disposed between the first interconnection layer and the second substrate, two through-holes penetrating a portion of the second interconnection layer, the first substrate, and the first interconnection layer, the two through-holes facing each other, first connection structures disposed on inner surfaces of the two through-holes, respectively, and extending from the first substrate toward the second interconnection layer, and first capping patterns disposed on the first connection structures, respectively, wherein the first interconnection layer includes a first interlayer insulating layer and a first interconnection pattern disposed on the first interlayer insulating layer, wherein the second interconnection layer includes a second interlayer insulating layer and second interconnection patterns disposed on the second interlayer insulating layer, wherein each of the two through-holes includes a first trench extending from a bottom surface of each of the two through-holes toward the second interconnection layer, wherein a bottom surface of the first trench is in contact with a corresponding second interconnection pattern among the second interconnection patterns, wherein the bottom surface of each of the two through-holes is in contact with the first interconnection pattern, wherein each of the first connection structures includes a first conductive layer disposed on an inner surface of each of the two through-holes, a first protective insulating layer disposed on the first conductive layer, and a first filling pattern disposed on the first protective insulating layer to fill a remaining portion of each of the two through-holes.

BRIEF DESCRIPTION OF THE DRAWINGS

The above and/or other aspects, features, and advantages of example embodiments will be more clearly understood from the following detailed description, taken in conjunction with the accompanying drawings, in which.

FIG. 5 is a plan view illustrating a stack region of an image sensor according to example embodiments;

DETAILED DESCRIPTION OF THE EMBODIMENTS

Hereinafter, example embodiments will be described in more detail with reference to the accompanying drawings.

Figure 1:
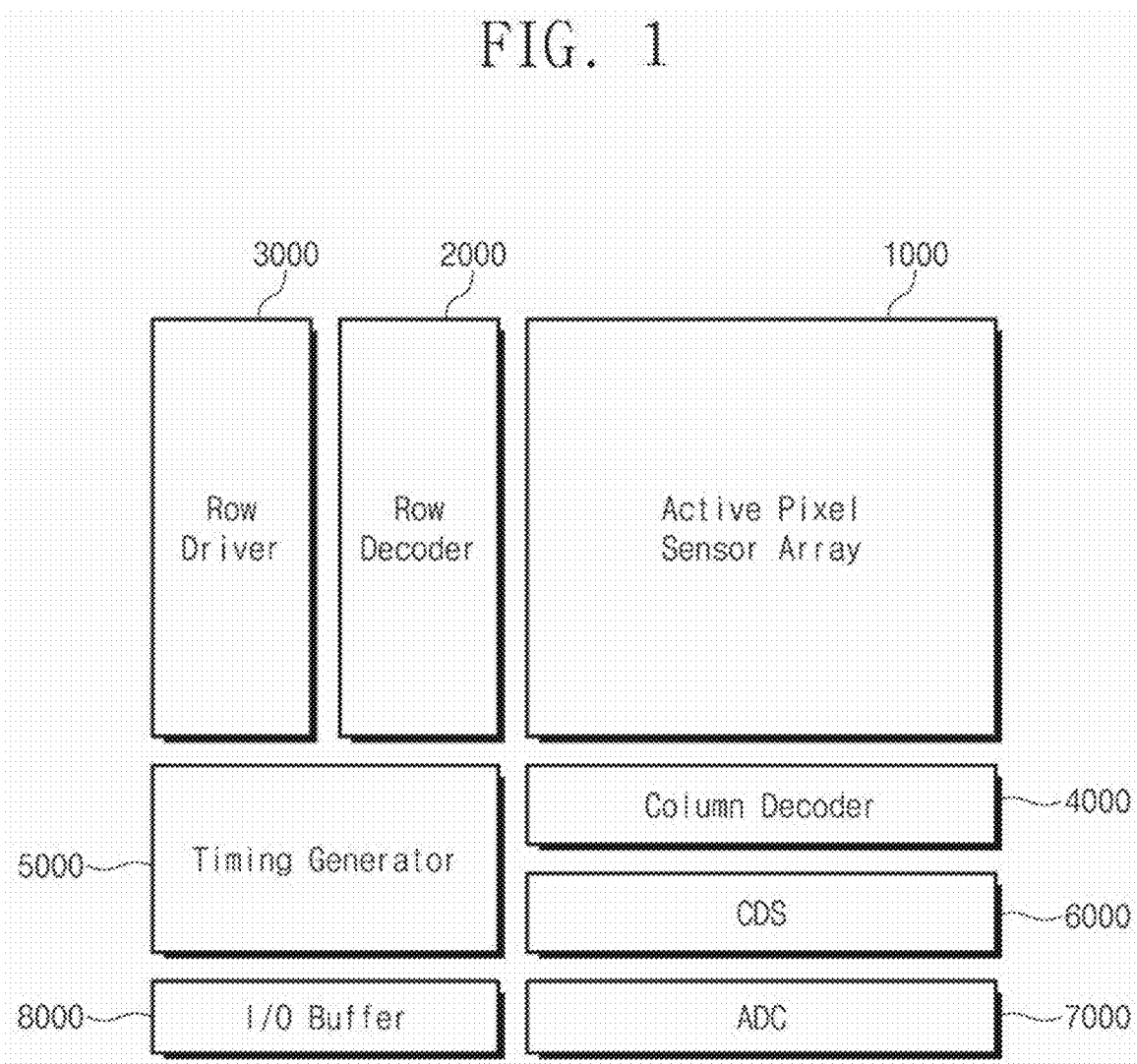
FIG. 1 is a schematic block diagram illustrating an image sensor according to example embodiments.

FIG. 1 is a schematic block diagram illustrating an image sensor according to example embodiments.

Referring to FIG. 1, an image sensor may include an active pixel sensor array 1000, a row decoder 2000, a row driver 3000, a column decoder 4000, a timing generator 5000, a correlated double sampler (CDS) 6000, an analog-to-digital converter (ADC) 7000, and an input/output (I/O) buffer 8000.

The active pixel sensor array 1000 may include a plurality of pixels two-dimensionally arranged and may convert optical signals into electrical signals. The active pixel sensor array 1000 may be driven by a plurality of driving signals, for example, a pixel selection signal, a reset signal, and a charge transfer signal, provided from the row driver 3000. In addition, electrical signals converted by the active pixel sensor array 1000 may be provided to the correlated double sampler 6000.

The row driver 3000 may provide a plurality of driving signals for driving the plurality of pixels to the active pixel sensor array 1000 in response to signals decoded in the row decoder 2000. When the pixels are arranged in a matrix form, the driving signals may be provided in the unit of row.

The timing generator 5000 may provide timing signals and control signals to the row decoder 2000 and the column decoder 4000.

The correlated double sampler 6000 may receive electrical signals generated from the active pixel sensor array 1000 and may hold and sample the received electrical signals. The correlated double sampler 6000 may doubly sample a specific noise level and a signal level of the electrical signal to output a difference level corresponding to a difference between the noise level and the signal level.

The analog-to-digital converter 7000 may convert an analog signal, which corresponds to the difference level outputted from the correlated double sampler 6000, into a digital signal and may output the digital signal.

The I/O buffer 8000 may latch the digital signals and may sequentially output the latched signals to an image signal processing unit in response to signals decoded in the column decoder 4000.

Figure 2:
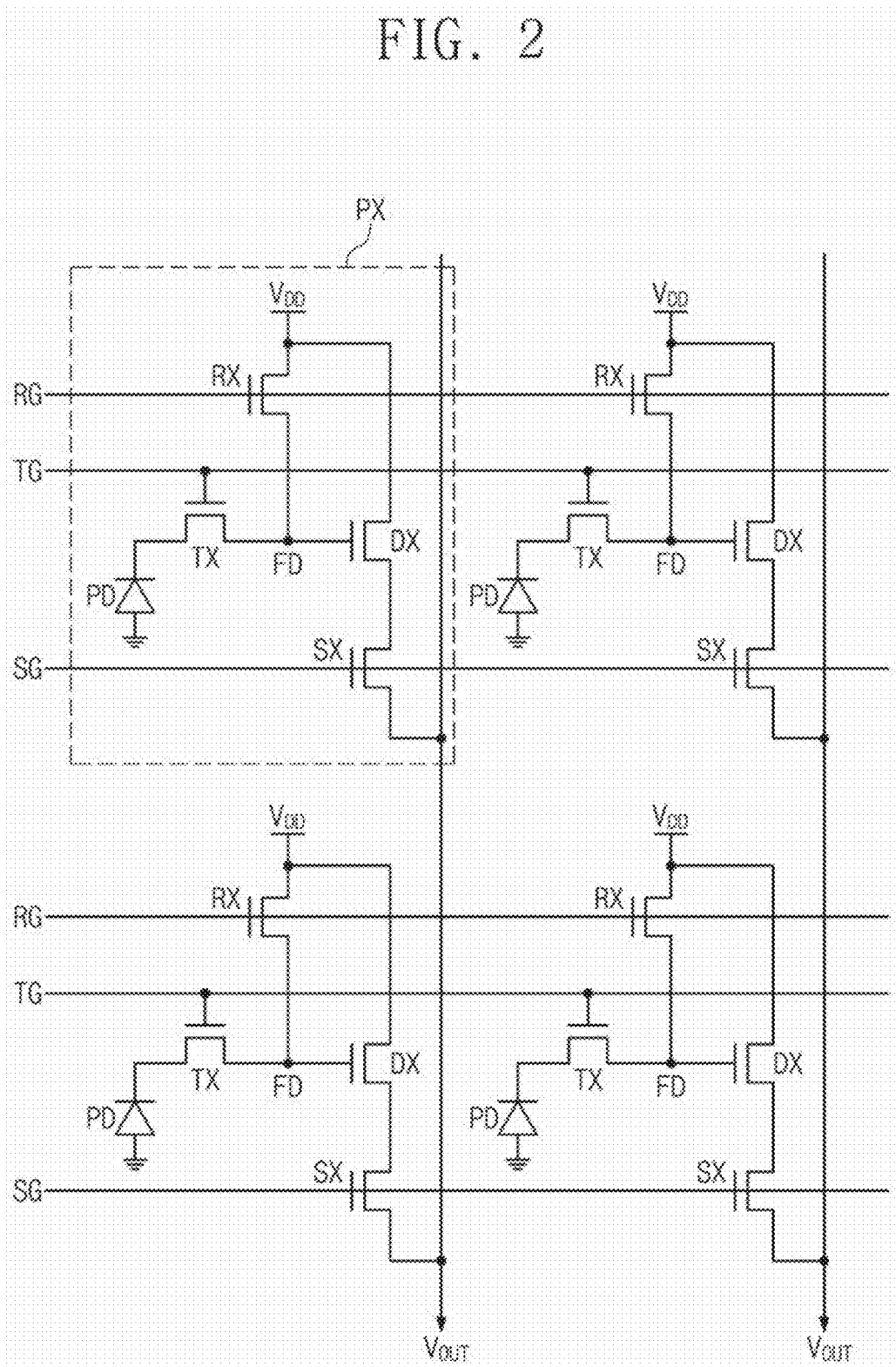
FIG. 2 is a circuit diagram illustrating an active pixel sensor array of an image sensor according to example embodiments.

FIG. 2 is a circuit diagram illustrating an active pixel sensor array of an image sensor according to example embodiments.

Referring to FIGS. 1 and 2, the active pixel sensor array 1000 may include a plurality of pixel regions PX, and the pixel regions PX may be arranged in a matrix form. Each of the pixel regions PX may include a transfer transistor TX and logic transistors RX, SX and DX. The logic transistors may include a reset transistor RX, a selection transistor SX, and a drive transistor DX. The transfer transistor TX, the reset transistor RX and the selection transistor SX may include a transfer gate TG, a reset gate RG and a selection gate SG, respectively. Each of the pixel regions PX may further include a photoelectric conversion element PD and a floating diffusion region FD.

The photoelectric conversion element PD may generate photocharges or charges in proportion to the amount of light incident from the outside and may accumulate the generated photocharges. The photoelectric conversion element PD may be a photodiode including a P-type dopant region and an N-type dopant region. The transfer transistor TX may transfer charges generated in the photoelectric conversion element PD to the floating diffusion region FD. The floating diffusion region FD may receive the charges generated in the photoelectric conversion element PD and may cumulatively store the received charges. The drive transistor DX may be controlled according to the amount of the photocharges accumulated in the floating diffusion region FD.

The reset transistor RX may periodically reset the charges accumulated in the floating diffusion region FD. A drain electrode of the reset transistor RX may be connected to the floating diffusion region FD, and a source electrode of the reset transistor RX may be connected to a power voltage VDD. When the reset transistor RX is turned-on, the power voltage VDD connected to the source electrode of the reset transistor RX may be applied to the floating diffusion region FD. Thus, when the reset transistor RX is turned-on, the charges accumulated in the floating diffusion region FD may be discharged to reset the floating diffusion region FD.

The drive transistor DX may function as a source follower buffer amplifier. The drive transistor DX may amplify a potential change in the floating diffusion region FD and may output the amplified potential change to an output line $V_{OUT}$.

The selection transistor SX may select the pixel regions PX to be sensed in the unit of row. When the selection transistor SX is turned-on, the power voltage VDD may be applied to a drain electrode of the drive transistor DX.

The pixel region PX including a single photoelectric conversion element PD and four transistors TX, RX, DX and SX is illustrated as an example in FIG. 2. However, embodiments are not limited thereto. For example, the reset transistor RX, the drive transistor DX and/or the selection transistor SX may be shared by the pixel regions PX adjacent to each other. Thus, the integration density of the image sensor may be improved.

Figure 3:
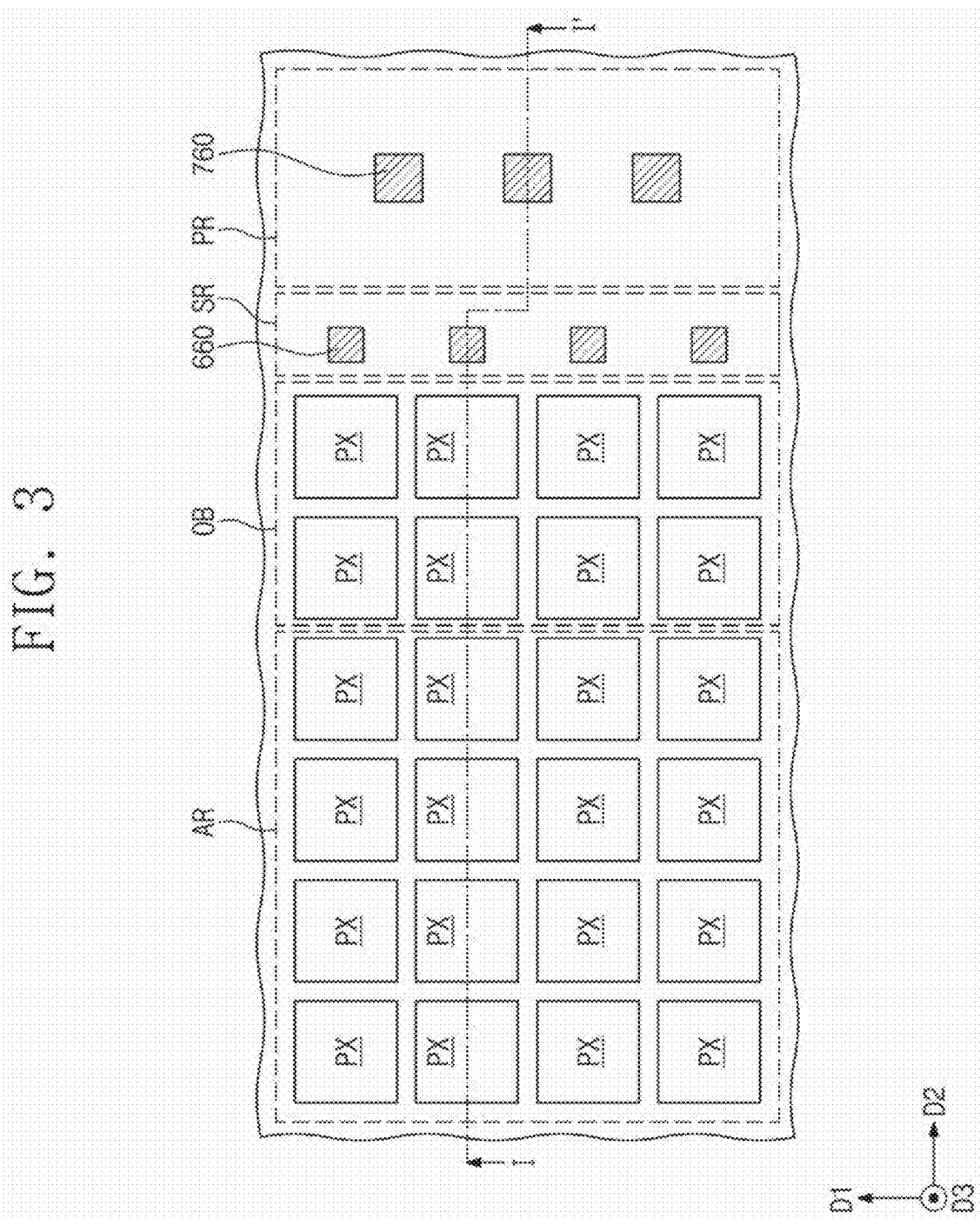
FIG. 3 is a plan view illustrating an image sensor according to example embodiments.
Figure 4:
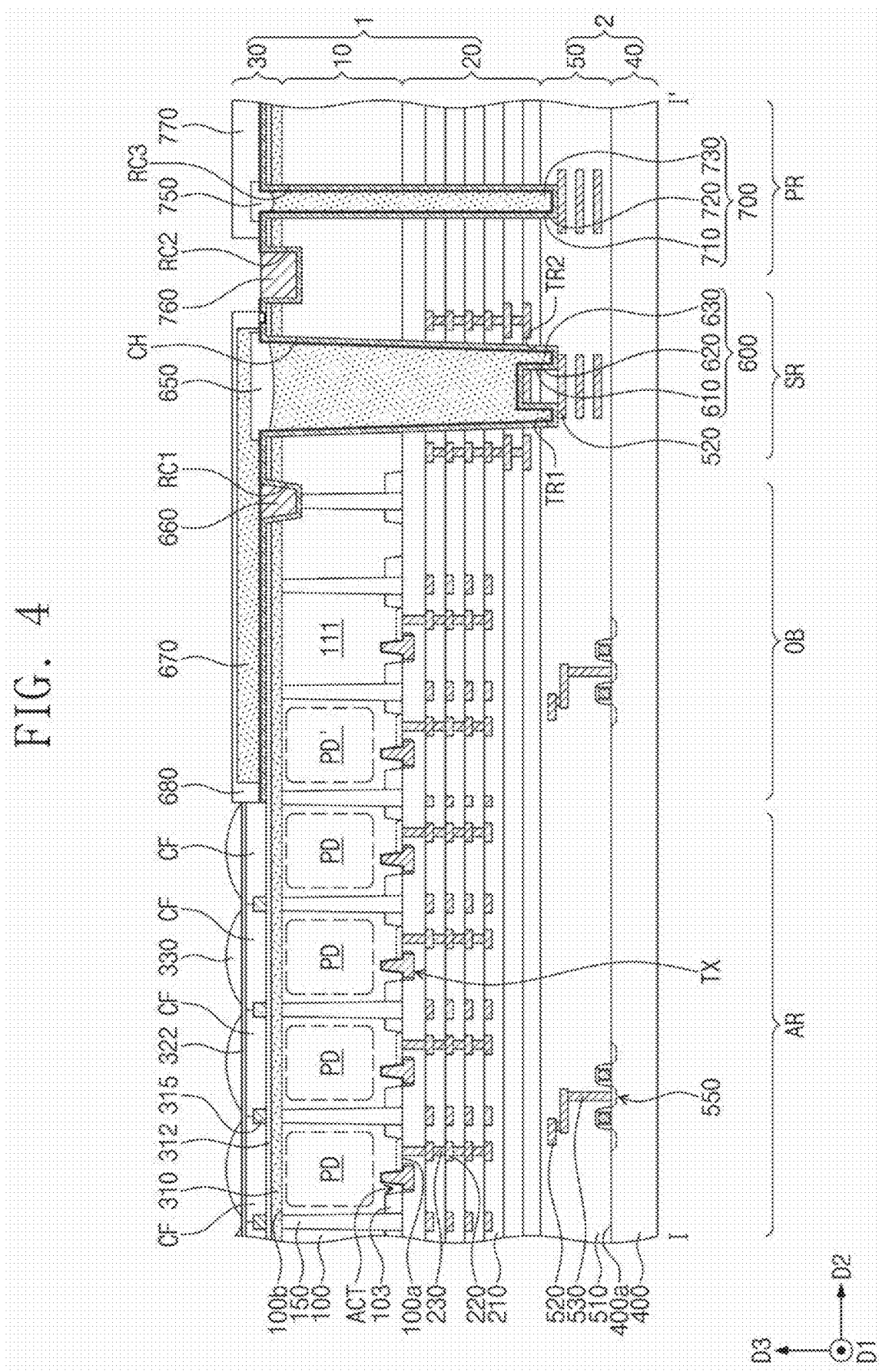
FIG. 4 is a cross-sectional view taken along a line I-I' of FIG. 3.

FIG. 3 is a plan view illustrating an image sensor according to example embodiments. FIG. 4 is a cross-sectional view taken along a line I-I' of FIG. 3.

Referring to FIGS. 3 and 4, an image sensor according to example embodiments may include a sensor chip 1 and a logic chip 2. The sensor chip 1 may be disposed on the logic chip 2. The sensor chip 1 may include a photoelectric conversion layer 10, a first interconnection layer 20, and a light transmitting layer 30.

The photoelectric conversion layer 10 may be disposed between the first interconnection layer 20 and the light transmitting layer 30. The photoelectric conversion layer 10 may include a first substrate 100. The first substrate 100 may be a semiconductor substrate, for example, a silicon substrate, a germanium substrate, a silicon-germanium substrate, a group II-VI compound semiconductor substrate, or a group III-V compound semiconductor substrate, or a silicon-on-insulator (SOI) substrate. The first substrate 100 may have a first surface 100a and a second surface 100b which are opposite to each other.

The first substrate 100 may include a pixel array region AR, an optical black region OB, a stack region SR, and a pad region PR when viewed in a plan view as illustrated in FIG. 3. The first substrate 100 of the pixel array region AR may include a plurality of pixel regions PX and a deep device isolation pattern 150 disposed between the pixel regions PX. The plurality of pixel regions PX may be two-dimensionally arranged in a first direction D1 and a second direction D2 which are parallel to the second surface 100b of the first substrate 100. The first direction D1 and the second direction D2 may intersect each other.

The deep device isolation pattern 150 may have a lattice or grid structure provided adjacent to and surrounding each of the plurality of pixel regions PX when viewed in a plan view. The deep device isolation pattern 150 may penetrate at least a portion of the first substrate 100 in a third direction D3 perpendicular to the second surface 100b of the first substrate 100. In example embodiments, the deep device isolation pattern 150 may extend from the first surface 100a of the first substrate 100 to the second surface 100b of the first substrate 100, and a bottom surface of the deep device isolation pattern 150 may be substantially coplanar with the second surface 100b of the first substrate 100. The deep device isolation pattern 150 may penetrate a shallow device isolation pattern 103 to be described later and may extend into the first substrate 100. The deep device isolation pattern 150 may prevent cross-talk between the pixel regions PX adjacent to each other. The deep device isolation pattern 150 may include an insulating material of which a refractive index is lower than that of the first substrate 100. The deep device isolation pattern 150 may include one or more insulating layers. For example, the deep device isolation pattern 150 may include, for example, a silicon oxide layer, a silicon oxynitride layer, and/or a silicon nitride layer.

A shallow device isolation pattern 103 may be disposed on the first surface 100a of the first substrate 100. The shallow device isolation pattern 103 may extend from the first surface 100a of the first substrate 100 into the first substrate 100. Each of the plurality of pixel regions PX may include active regions ACT defined by the shallow device isolation pattern 103. For example, the shallow device isolation pattern 103 may include at least one of, for example, a silicon oxide layer, a silicon nitride layer, or a silicon oxynitride layer.

Each of the plurality of pixel regions PX may include a photoelectric conversion region PD and a doped region extending along a sidewall of the deep device isolation pattern 150. Hereinafter, the photoelectric conversion region PD may indicate a region in which the photoelectric conversion element PD of FIGS. 1 and 2 is disposed. The doped region may be disposed between the photoelectric conversion region PD and the deep device isolation pattern 150.

The first substrate 100 may have a first conductivity type, and the photoelectric conversion region PD may be a region doped with dopants having a second conductivity type different from the first conductivity type. For example, the first conductivity type and the second conductivity type may be a P-type and an N-type, respectively. In this case, the second conductivity type dopants may include N-type dopants such as, for example, phosphorus, arsenic, bismuth, and/or antimony. The photoelectric conversion region PD and the first substrate 100 may form a PN junction to constitute a photodiode. The doped region may be a region doped with dopants having the first conductivity type. The doped region may prevent electrons, which are trapped in dangling bonds existing at a sidewall of each of the plurality of pixel regions PX, from moving into the photoelectric conversion region PD, and thus, a dark current and/or a white spot phenomenon in the image sensor may be reduced or minimized. For example, the first conductivity type dopants may include P-type dopants such as boron.

Transfer transistors TX may be disposed on the first surface 100a of the first substrate 100. Each of the transfer transistors TX may be disposed on a corresponding active region ACT of each of the pixel regions PX. The logic transistors RX, SX and DX of FIG. 2 may also be disposed on the first surface 100a of the first substrate 100. Each of the logic transistors RX, SX and DX may be disposed on a corresponding active region ACT of each of the pixel regions PX.

The first interconnection layer 20 may be disposed on the first surface 100a of the first substrate 100. The first interconnection layer 20 may include a plurality of first interlayer insulating layers 210 stacked on the first surface 100a of the first substrate 100. The first interconnection layer 20 may include first interconnection patterns 220 and first vias 230, which are disposed in the first interlayer insulating layers 210. One or more of the first interconnection patterns 220 and one or more of the first vias 230 may be disposed in each of the first interlayer insulating layers 210. The first interlayer insulating layers 210 may be disposed on the first surface 100a of the first substrate 100 to cover the transistors TX, RX, SX and DX, and some of the first vias 230 may be connected to terminals of the transistors TX, RX, SX and DX. Each of the first vias 230 may be connected to a corresponding one of the first interconnection patterns 220. The first interconnection patterns 220 may be electrically connected to the transistors TX, RX, SX and DX through the first vias 230. The first interlayer insulating layers 210 may include an insulating material, and the first vias 230 and the first interconnection patterns 220 may include a conductive material.

The light transmitting layer 30 may be disposed on the second surface 100b of the first substrate 100. The light transmitting layer 30 may include an anti-reflection layer 310, a first insulating layer 312, a plurality of color filters CF, and a plurality of micro lenses 330. The light transmitting layer 30 may concentrate and filter light incident from the outside and may provide the light to the photoelectric conversion layer 10.

The anti-reflection layer 310 may be disposed on the second surface 100b of the first substrate 100. The anti-reflection layer 310 may conformally cover the second surface 100b of the first substrate 100. The anti-reflection layer 310 may prevent reflection of light such that light incident to the second surface 100b of the first substrate 100 reaches the photoelectric conversion region PD. For example, the anti-reflection layer 310 may include at least one of silicon oxide, silicon nitride, silicon oxynitride, or a high-k dielectric material, for example, hafnium oxide or aluminum oxide.

The plurality of color filters CF may be disposed on the first insulating layer 312. Each of the plurality of color filters CF may vertically overlap with the photoelectric conversion region PD of a corresponding pixel region PX in the third direction D3. Each of the color filters CF may include a red, green or blue color filter, depending on a unit pixel. The color filters CF may be two-dimensionally arranged. In example embodiments, each of the color filters CF may include a yellow filter, a magenta filter, or a cyan filter.

The micro lenses 330 may be disposed on the plurality of color filters 320. Each of the plurality of micro lenses 330 may vertically overlap with the photoelectric conversion region PD of a corresponding pixel region PX in the third direction D3. The micro lenses 330 may have convex shapes to concentrate light incident to the pixel regions PX.

The first insulating layer 312 may be disposed on the anti-reflection layer 310. The first insulating layer 312 may conformally cover a top surface of the anti-reflection layer 310. The first insulating layer 312 may be disposed between the anti-reflection layer 310 and the color filters CF, and a second insulating layer 322 may be disposed between the color filters CF and the micro lenses 330. The first insulating layer 312 may include, for example, metal oxide and/or a nitride. The metal oxide may include, for example, aluminum oxide, and the nitride may include, for example, silicon nitride.

A grid pattern 315 may be disposed between the first insulating layer 312 and the color filters CF. The grid pattern 315 may vertically overlap with the deep device isolation pattern 150 in the third direction D3. The grid pattern 315 may guide light, which is incident to the second surface 100b of the first substrate 100, into the photoelectric conversion region PD. The grid pattern 315 may include, for example, a metal. Each of the color filters CF may extend between adjacent portions of the grid pattern 315 so as to be in contact with the first insulating layer 312.

An additional photoelectric conversion region PD' and a dummy region 111 may be provided in corresponding pixel regions PX of the optical black region OB. The additional photoelectric conversion region PD' may be a region doped with dopants, for example, N-type dopants, having the second conductivity type different from the first conductivity type of the first substrate 100. The additional photoelectric conversion region PD' may have a structure similar to those of the photoelectric conversion regions PD in the plurality of pixel regions PX of the pixel array region AR but may not perform the operation of receiving light to generate an electrical signal as the photoelectric conversion regions PD. The dummy region 111 may not be doped with dopants.

The logic chip 2 may include a base substrate layer 40 and a second interconnection layer 50. The second interconnection layer 50 may be disposed between the first interconnection layer 20 and the base substrate layer 40. The base substrate layer 40 may include a second substrate 400. Integrated circuits 550 may be disposed on a top surface 400a of the second substrate 400. In example embodiments, the integrated circuits 550 may be disposed in the second substrate 400. The integrated circuits 550 may include logic circuits, memory circuits, or a combination thereof. For example, the integrated circuits 550 may include transistors. The second interconnection layer 50 may include a plurality of second interlayer insulating layers 510.

The second interconnection layer 50 may include second interconnection patterns 520 and second vias 530, which are disposed in the second interlayer insulating layers 510. One or more of the second interconnection patterns 520 and one or more of the second vias 530 may be disposed in each of the second interlayer insulating layers 510. Each of the second vias 530 may be connected to a corresponding one of the second interconnection patterns 520. Some of the second interconnection patterns 520 and some of the second vias 530 may be electrically connected to the integrated circuits 550. The second interlayer insulating layers 510 may include an insulating material, and the second vias 530 and the second interconnection patterns 520 may include a conductive material.

A conductive contact 660 may be disposed on the optical black region OB. A first connection structure 600 and a first capping pattern 650 may be disposed on the optical black region OB and the stack region SR of the first substrate 100. A bulk color filter 670 and a first protective layer 680 may be disposed on the optical black region OB and the stack region SR of the first substrate 100.

The conductive contact 660 may fill a first recess region RC1 formed in the optical black region OB. The conductive contact 660 may be connected to the deep device isolation pattern 150. The conductive contact 660 may include a metal material, for example, aluminum.

The first connection structure 600 may include a first conductive layer 610, a first protective insulating layer 620, and a first filling pattern 630. The first conductive layer 610 may be disposed on the second surface 100b of the first substrate 100. The first conductive layer 610 may cover the first insulating layer 312 and may conformally cover an inner surface, for example, an inner sidewall and a bottom surface, of each of the first recess region RC1 and a through-hole CH formed in the stack region SR. The first conductive layer 610 may penetrate the photoelectric conversion layer 10 and the first interconnection layer 20. The first conductive layer 610 may be electrically connected to at least one of the first interconnection patterns 220 in the first interconnection layer 20 and at least one of the second interconnection patterns 520 in the second interconnection layer 50. Thus, the first connection structure 600 may electrically connect the photoelectric conversion layer 10 to the second interconnection layer 50. The first conductive layer 610 may include a metal material. For example, the first conductive layer 610 may include a metal such as copper, tungsten, aluminum, titanium, tantalum, and/or any alloy thereof. The first conductive layer 610 may block light incident to the optical black region OB. An isolation pattern 160 to be described later may be disposed at both sides of the through-hole CH.

The first protective insulating layer 620 may be disposed on a top surface of the conductive contact 660 and the first conductive layer 610. The first protective insulating layer 620 may extend into the through-hole CH. The first protective insulating layer 620 in the through-hole CH may be disposed between the first conductive layer 610 and the first filling pattern 630. The first protective insulating layer 620 may include a high-k dielectric material, for example, aluminum oxide and/or hafnium oxide.

The first filling pattern 630 may be provided in the through-hole CH to fill a remaining portion of the through-hole CH. The first filling pattern 630 may penetrate the photoelectric conversion layer 10 and the first interconnection layer 20. The first filling pattern 630 may include an insulating material.

The first capping pattern 650 may be disposed on a top surface of the first filling pattern 630. A bottom surface of the first capping pattern 650 may be convex downward, for example, toward the first surface 100a of the first substrate 100. A top surface of the first capping pattern 650 may be substantially flat. The first capping pattern 650 may include an insulating polymer such as a photoresist material.

The bulk color filter 670 may be disposed on the first connection structure 600 and the conductive contact 660. The bulk color filter 670 may cover the first connection structure 600 and the conductive contact 660. The first protective layer 680 may be disposed on the bulk color filter 670. For example, the first protective layer 680 may seal or encapsulate the bulk color filter 670.

A second connection structure 700, a pad contact 760 and a second protective layer 770 may be disposed on the pad region PR of the first substrate 100. The second connection structure 700 may be spaced apart from the first connection structure 600 in a second direction D2 parallel to the first surface 100a of the first substrate 100. The second connection structure 700 may include a second conductive layer 710, a second protective insulating layer 720, a second filling pattern 730, and a second capping pattern 750. The second conductive layer 710 may be disposed on the second surface 100b of the first substrate 100. The second conductive layer 710 may cover the first insulating layer 312 and may conformally cover an inner surface, for example, an inner sidewall and a bottom surface, of each of a second recess region RC2 and a third recess region RC3. The second conductive layer 710 may penetrate the photoelectric conversion layer 10 and the first interconnection layer 20. The second conductive layer 710 may be connected to the second interconnection patterns 520 in the second interconnection layer 50. Thus, the second connection structure 700 may electrically connect the photoelectric conversion layer 10 to the second interconnection layer 50. The second conductive layer 710 may include a metal material. For example, the second conductive layer 710 may include a metal such as, for example, copper, tungsten, aluminum, titanium, tantalum, and/or any alloy thereof. The second conductive layer 710 may block light incident to the pad region PR.

The second protective insulating layer 720 may be disposed on the second conductive layer 710. The second protective insulating layer 720 may extend into the third recess region RC3. The second protective insulating layer 720 in the third recess region RC3 may be disposed between the second conductive layer 710 and the second filling pattern 730. The second protective insulating layer 720 may expose the pad contact 760. The second protective insulating layer 720 may include a high-k dielectric material, for example, aluminum oxide and/or hafnium oxide.

The second filling pattern 730 may be provided in the third recess region RC3 to fill a remaining portion of the third recess region RC3. The second filling pattern 730 may penetrate the photoelectric conversion layer 10 and the first interconnection layer 20. The second filling pattern 730 may include an insulating material.

The second capping pattern 750 may be disposed on a top surface of the second filling pattern 730. A bottom surface of the second capping pattern 750 may be convex downward. A top surface of the second capping pattern 750 may be substantially flat. The second capping pattern 750 may include an insulating polymer such as a photoresist material. The second protective layer 770 may cover the second connection structure 700.

The pad contact 760 may be disposed between the first connection structure 600 and the second connection structure 700. The pad contact 760 may fill a remaining portion of the second recess region RC2. The pad contact 760 may include a metal material, for example, aluminum. The pad contact 760 may function as an electrical connection path between the image sensor and an external device. A current applied through the pad contact 760 may flow to a semiconductor pattern in the deep device isolation pattern 150 through the second conductive layer 710, the first interconnection patterns 220 of the first interconnection layer 20, and the first conductive layer 610. Electrical signals generated from the photoelectric conversion regions PD in the plurality of pixel regions PX of the pixel array region AR may be transmitted to the outside through the first interconnection patterns 220 of the first interconnection layer 20, the second conductive layer 710, and the pad contact 760.

Figure 6A:
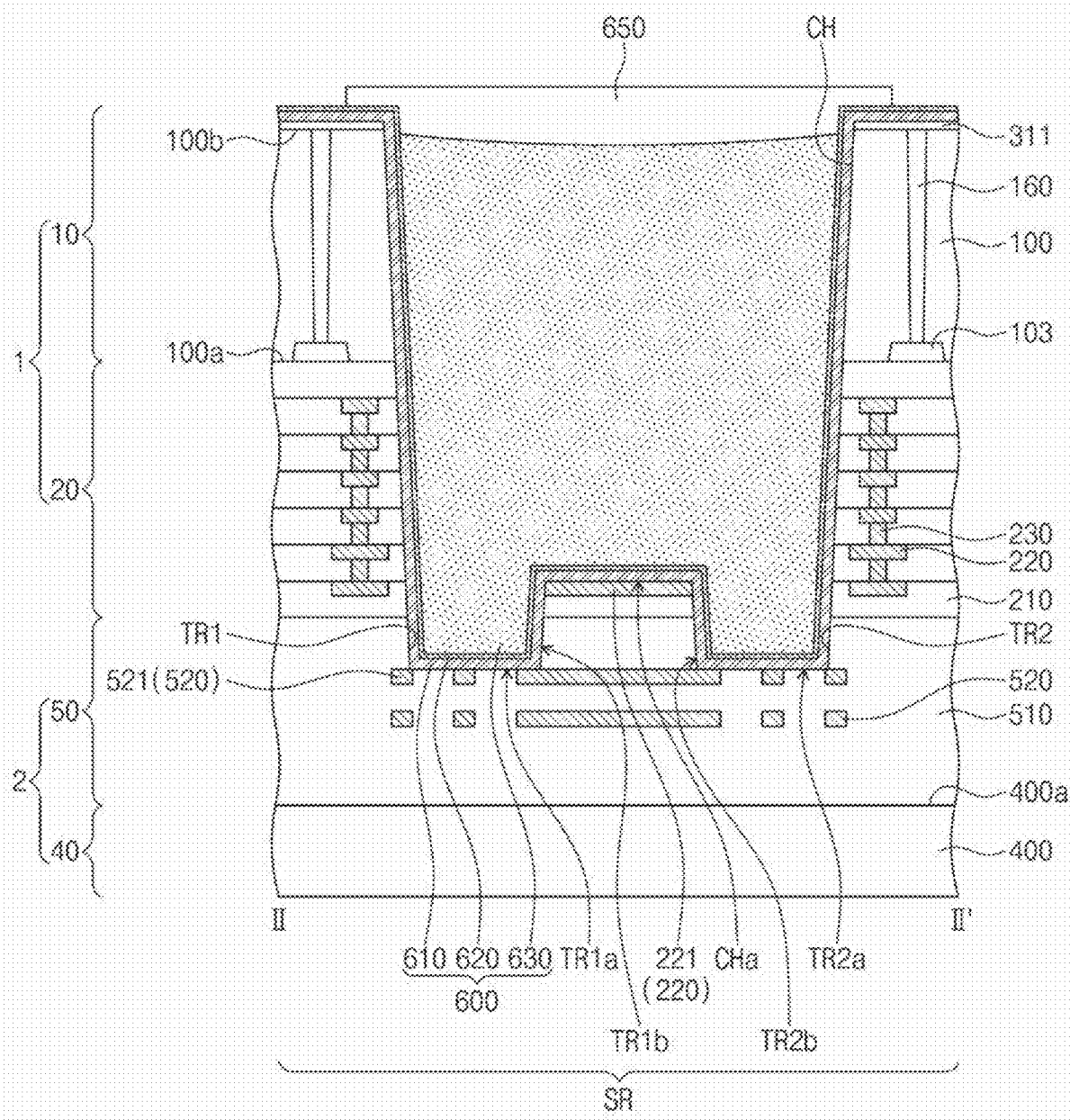
FIG. 6A is a cross-sectional view taken along a line II-II' of FIG. 5.

FIG. 5 is a plan view illustrating a stack region of an image sensor according to example embodiments. FIG. 6A is a cross-sectional view taken along a line II-II' of FIG. 5. Hereinafter, the first connection structure 600 will be described in more detail with reference to FIGS. 5 and 6A.

Referring to FIGS. 5 and 6A, a single through-hole CH may be provided in the first substrate 100. The through-hole CH may penetrate a portion of the second interconnection layer 50, the first substrate 100, and the first interconnection layer 20. The through-hole CH may include a first trench TR1 and a second trench TR2, each of which extends from a bottom surface CHa of each of both end portions of the through-hole CH toward the second interconnection layer 50. A bottom surface TR1a of the first trench TR1 and a bottom surface TR2a of the second trench TR2 may be located at substantially the same level. The bottom surface CHa of the through-hole CH between the first trench TR1 and the second trench TR2 may be located at a higher level than the bottom surface TR1a of the first trench TR1 and the bottom surface TR2a of the second trench TR2. In the present specification, the term "level" may be a height from the top surface 400a of the second substrate 400.

The bottom surface TR1a of the first trench TR1 and the bottom surface TR2a of the second trench TR2 may be in contact with a corresponding second interconnection pattern 521 of the second interconnection patterns 520. For example, the corresponding second interconnection pattern 521 may be an uppermost one of the second interconnection patterns 520. However, the corresponding second interconnection pattern 521 is not limited to the uppermost one of the second interconnection patterns 520. For example, at least one second interconnection pattern 520 may further be disposed on the corresponding second interconnection pattern 521.

The bottom surface CHa of the through-hole CH between the first trench TR1 and the second trench TR2 may be in contact with a corresponding first interconnection pattern 221 of the first interconnection patterns 220. For example, the corresponding first interconnection pattern 221 may be a lowermost one of the first interconnection patterns 220. The corresponding first interconnection pattern 221 may be disposed between an outer sidewall TR1b of the first trench TR1 and an outer sidewall TR2b of the second trench TR2. The outer sidewall TR1b of the first trench TR1 and the outer sidewall TR2b of the second trench TR2 may be outer sidewalls adjacent to each other. For example, the corresponding first interconnection pattern 221 may be in contact with the outer sidewall TR1b of the first trench TR1 and the outer sidewall TR2b of the second trench TR2.

The first connection structure 600 may be disposed on an inner surface of the through-hole CH. The first connection structure 600 may include a first conductive layer 610 conformally covering the inner surface of the through-hole CH, for example, an inner sidewall and the bottom surface CHa of the through-hole CH and inner surfaces of the first and second trenches TR1 and TR2, a first protective insulating layer 620 disposed on the first conductive layer 610 to conformally cover the first conductive layer 610, and a first filling pattern 630 disposed on the first protective insulating layer 620 to fill a remaining portion of the through-hole CH. For example, the shape of the first conductive layer 610 and the first protective insulating layer 620 may have a shape corresponding to the through-hole CH in a cross-sectional view. The first conductive layer 610 may be electrically connected to the first interconnection patterns 220 and the second interconnection patterns 520 to electrically connect the sensor chip 1 to the logic chip 2. For example, the sensor chip 1 and the logic chip 2 may be electrically connected to each other by the first connection structure 600. The first capping pattern 650 may be disposed on a top surface of the first filling pattern 630.

The corresponding first interconnection pattern 221 may have a shape including at least one first opening OP1 when viewed in a plan view as illustrated in FIG. 5. For example, the corresponding first interconnection pattern 221 may have a shape including two first openings OP1. A portion of the corresponding second interconnection pattern 521 may be disposed in one of the first openings OP1 when viewed in a plan view, and another portion of the corresponding second interconnection pattern 521 may be disposed in another of the first openings OP1 when viewed in a plan view. The corresponding second interconnection pattern 521 may have a shape including at least one second opening OP2. For example, the corresponding second interconnection pattern 521 may have a shape including four second openings OP2.

An upper insulating layer 311 may be disposed on the second surface 100b of the first substrate 100. The upper insulating layer 311 may be disposed between the second surface 100b of the first substrate 100 and the first conductive layer 610. The upper insulating layer 311 may include the anti-reflection layer 310 and/or the first insulating layer 312 of FIG. 4. For example, the upper insulating layer 311 may include at least one of silicon oxide, silicon nitride, silicon oxynitride, or a high-k dielectric material, for example, hafnium oxide or aluminum oxide.

An isolation pattern 160 may be provided in the first substrate 100 and may be disposed at both sides of the through-hole CH. The isolation pattern 160 may be disposed on the shallow device isolation pattern 103. The isolation pattern 160 may be provided adjacent to and surround the through-hole CH when viewed in a plan view. The isolation pattern 160 may have a quadrilateral or rectangular ring shape when viewed in a plan view. For example, the isolation pattern 160 may include at least one of silicon oxide, silicon nitride, silicon oxynitride, or a high-k dielectric material, for example, hafnium oxide or aluminum oxide. In example embodiments, the isolation pattern 160 may be formed by a process different from a process of forming the deep device isolation pattern 150. In example embodiments, the isolation pattern 160 may be formed by the same process as the deep device isolation pattern 150.

In the image sensor according to the example embodiments, the through-hole CH penetrating the sensor chip 1 and a portion of the logic chip 2 may include the first trench TR1 and the second trench TR2 which extend from the bottom surface CHa of the through-hole CH toward the second interconnection layer 50 of the logic chip 2. Thus, a planar area of the first connection structure 600 connecting the logic chip 2 and the sensor chip 1 may be reduced, and connection failure between the logic chip 2 and the sensor chip 1 may be prevented. In addition, an upper width of the through-hole CH may be increased, and thus a manufacturing process may be facilitated.

Figure 6B:
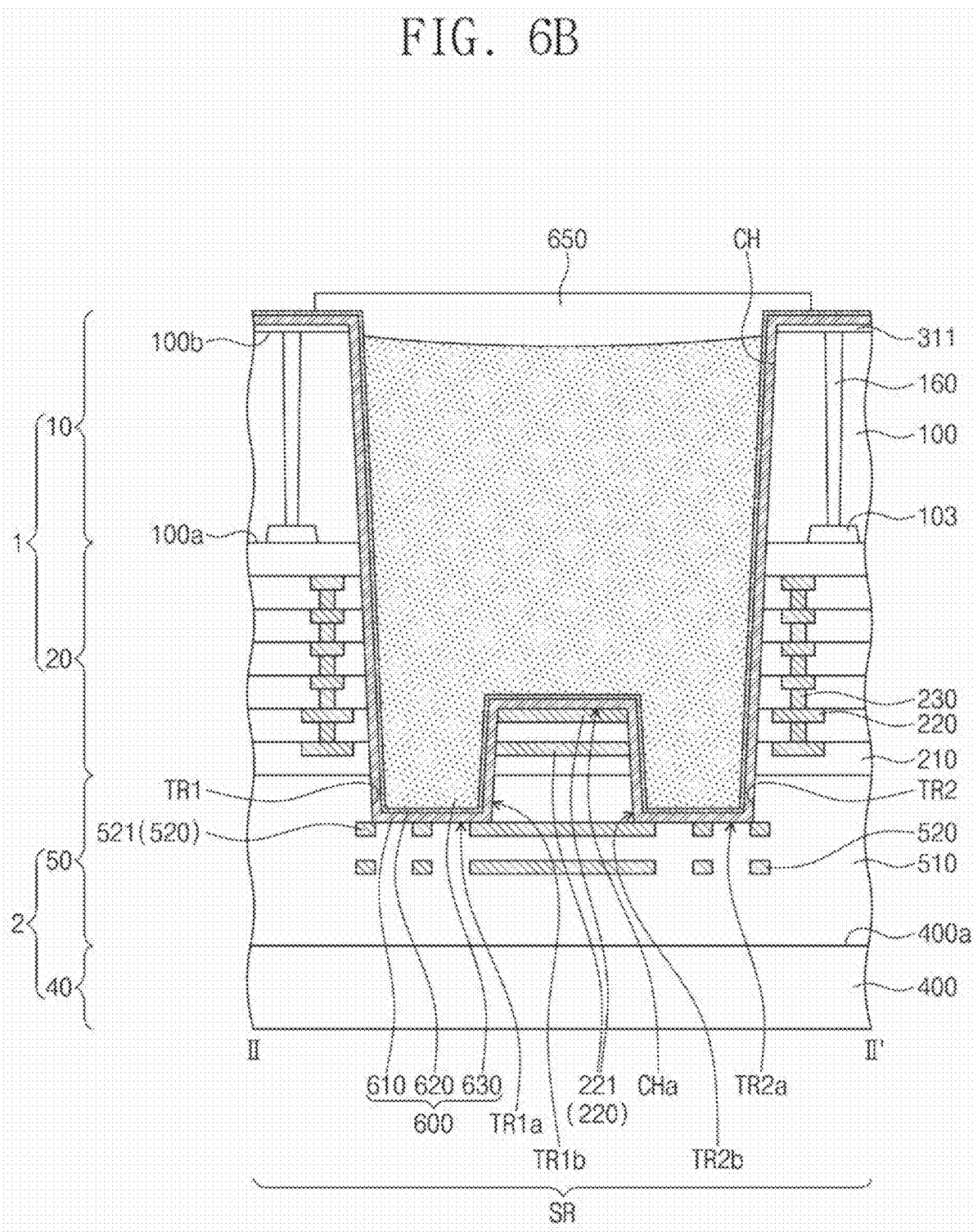
FIG. 6B is a cross-sectional view taken along the line II-II' of FIG. 5.

FIG. 6B is a cross-sectional view taken along the line II-II' of FIG. 5 to illustrate a stack region of an image sensor according to example embodiments. Hereinafter, the descriptions to the same features and components as mentioned above will be omitted for the purpose of ease and convenience in explanation.

Referring to FIGS. 5 and 6B, the bottom surface TR1a of the first trench TR1 and the bottom surface TR2a of the second trench TR2 may be in contact with a corresponding second interconnection pattern 521 of the second interconnection patterns 520.

The bottom surface CHa of the through-hole CH between the first trench TR1 and the second trench TR2 may be in contact with a corresponding first interconnection pattern 221 of the first interconnection patterns 220. The corresponding first interconnection pattern 221 may not be the lowermost one of the first interconnection patterns 220. For example, at least one first interconnection pattern 221 being in contact with the outer sidewall TR1b of the first trench TR1 and the outer sidewall TR2b of the second trench TR2 may further be disposed under the corresponding first interconnection pattern 221. For example, at least one first interconnection pattern 221 disposed under the corresponding first interconnection pattern 221 may be a single first interconnection pattern 221. However, embodiments are not limited thereto. For example, at least one first interconnection pattern 221 disposed under the corresponding first interconnection pattern 221 may include a plurality of stacked first interconnection patterns 221.

The corresponding first interconnection pattern 221 and at least one first interconnection pattern 221 disposed under the corresponding first interconnection pattern 221 may be disposed between the outer sidewall TR1b of the first trench TR1 and the outer sidewall TR2b of the second trench TR2. For example, the corresponding first interconnection pattern 221 and at least one first interconnection pattern 221 disposed under the corresponding first interconnection pattern 221 may be in contact with the outer sidewall TR1b of the first trench TR1 and the outer sidewall TR2b of the second trench TR2.

Figure 7:
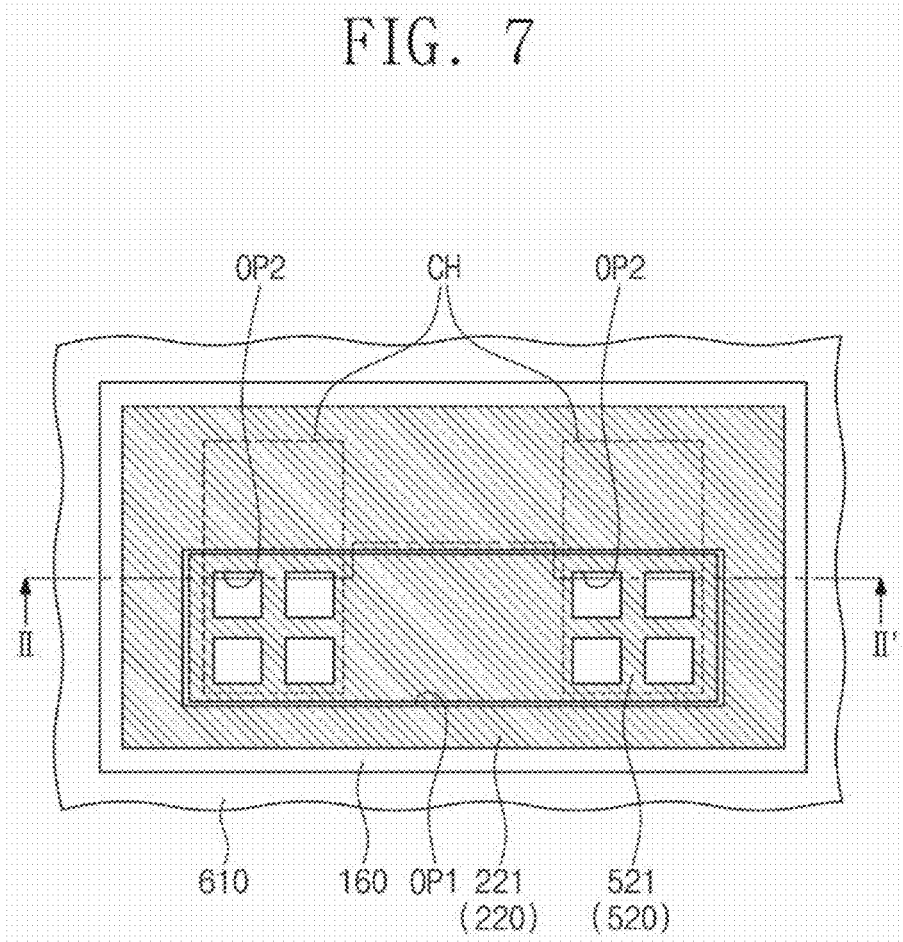
FIG. 7 is a plan view illustrating a stack region of an image sensor according to example embodiments.
Figure 8:
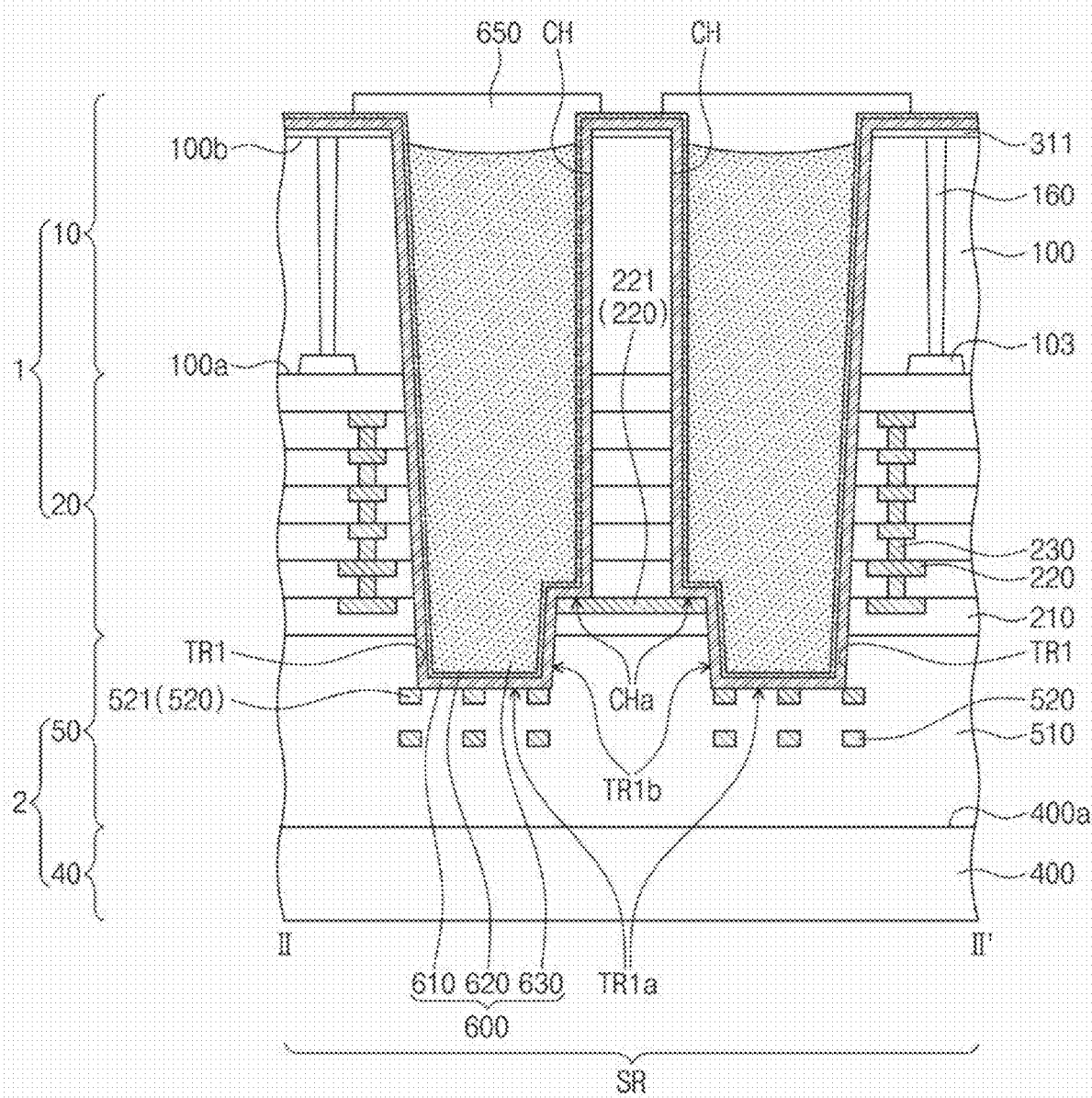
FIG. 8 is a cross-sectional view taken along a line II-II' of FIG. 7.

FIG. 7 is a plan view illustrating a stack region of an image sensor according to example embodiments. FIG. 8 is a cross-sectional view taken along a line II-II' of FIG. 7. Hereinafter, the descriptions to the same components and/or features as in the above example embodiments will be omitted for the purpose of ease and convenience in explanation.

Referring to FIGS. 7 and 8, two through-holes CH may be provided in the first substrate 100. Each of the through-holes CH may penetrate a portion of the second interconnection layer 50, the first substrate 100, and the first interconnection layer 20. Each of the through-holes CH may include a first trench TR1 extending from a bottom surface CHa of each of the through-holes CH toward the second interconnection layer 50. The bottom surface CHa of the through-hole CH may be located at a higher level than a bottom surface TR1a of the first trench TR1. The through-holes CH may be disposed to face each other and may be symmetrical with respect to a corresponding first interconnection pattern 221 disposed between the through-holes CH.

The bottom surface TR1a of each of the first trenches TR1 may be in contact with a corresponding second interconnection pattern 521 of the second interconnection patterns 520. For example, the corresponding second interconnection pattern 521 may be an uppermost one of the second interconnection patterns 520. However, the corresponding second interconnection pattern 521 is not limited to the uppermost one of the second interconnection patterns 520. For example, at least one second interconnection pattern may further be disposed on the corresponding second interconnection pattern 521.

The bottom surface CHa of each of the through-holes CH may be in contact with a corresponding first interconnection pattern 221 of the first interconnection patterns 220. For example, the corresponding first interconnection pattern 221 may be a lowermost one of the first interconnection patterns 220. However, the corresponding first interconnection pattern 221 is not limited to the lowermost one of the first interconnection patterns 220. For example, at least one first interconnection pattern being in contact with the outer sidewalls TR1b of the first trenches TR1 may further be disposed under the corresponding first interconnection pattern 221. In example embodiments, at least one first interconnection pattern disposed under the corresponding first interconnection pattern 221 may be a single first interconnection pattern. In example embodiments, at least one first interconnection pattern disposed under the corresponding first interconnection pattern 221 may include a plurality of stacked first interconnection patterns. The corresponding first interconnection pattern 221 may be disposed between the outer sidewalls TR1b of the first trenches TR1. The outer sidewalls TR1b of the first trenches TR1 may be adjacent to each other. For example, the corresponding first interconnection pattern 221 may be in contact with the outer sidewall TR1b of each of the first trenches TR1.

First connection structures 600 may be disposed on inner surfaces of the through-holes CH, respectively. Each of the first connection structures 600 may include a first conductive layer 610 conformally covering the inner surface of the through-hole CH, for example, an inner sidewall and the bottom surface CHa and an inner surface of the first trench TR1, a first protective insulating layer 620 disposed on the first conductive layer 610 to conformally cover the first conductive layer 610, and a first filling pattern 630 disposed on the first protective insulating layer 620 to fill a remaining portion of the through-hole CH. The first conductive layer 610 may be electrically connected to the first interconnection patterns 220 and the second interconnection patterns 520 to electrically connect the sensor chip 1 to the logic chip 2. For example, the sensor chip 1 and the logic chip 2 may be electrically connected to each other by the first connection structure 600.

The corresponding first interconnection pattern 221 may have a shape including at least one first opening OP1 when viewed in a plan view. For example, the corresponding first interconnection pattern 221 may have a shape including a single first opening OP1. The corresponding second interconnection pattern 521 may be disposed in the first opening OP1 when viewed in a plan view. The corresponding second interconnection pattern 521 may have a shape including at least one second opening OP2. For example, the corresponding second interconnection pattern 521 may have a shape including four second openings OP2.

An isolation pattern 160 may be provided in the first substrate 100 and may be disposed at both sides of the through-holes CH. The isolation pattern 160 may be disposed on the shallow device isolation pattern 103. The isolation pattern 160 may be provided adjacent to and surround the through-holes CH when viewed in a plan view. The isolation pattern 160 may have a quadrilateral or rectangular ring shape when viewed in a plan view.

In the image sensor according to the example embodiments, each of the through-holes CH penetrating the sensor chip 1 and a portion of the logic chip 2 may include the first trench TR1 extending from the bottom surface CHa of each of the through-holes CH toward the second interconnection layer 50 of the logic chip 2. Thus, connection failure between the logic chip 2 and the sensor chip 1 may be prevented.

Figure 9:
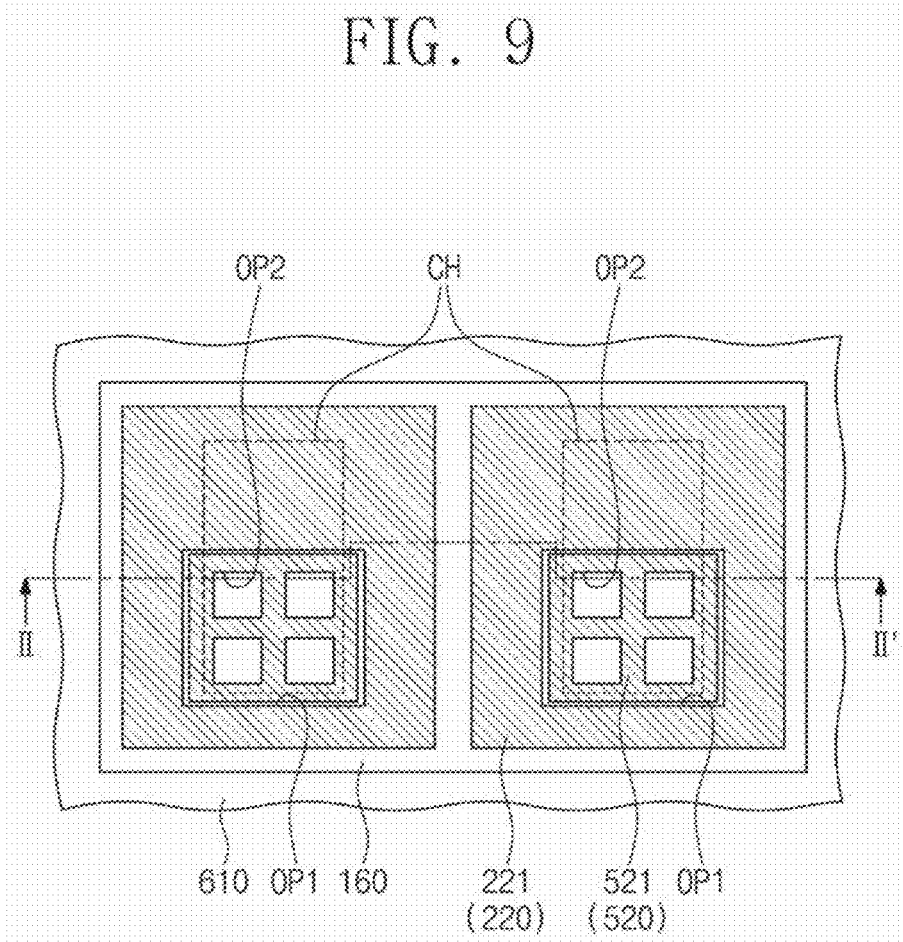
FIG. 9 is a plan view illustrating a stack region of an image sensor according to example embodiments.
Figure 10:
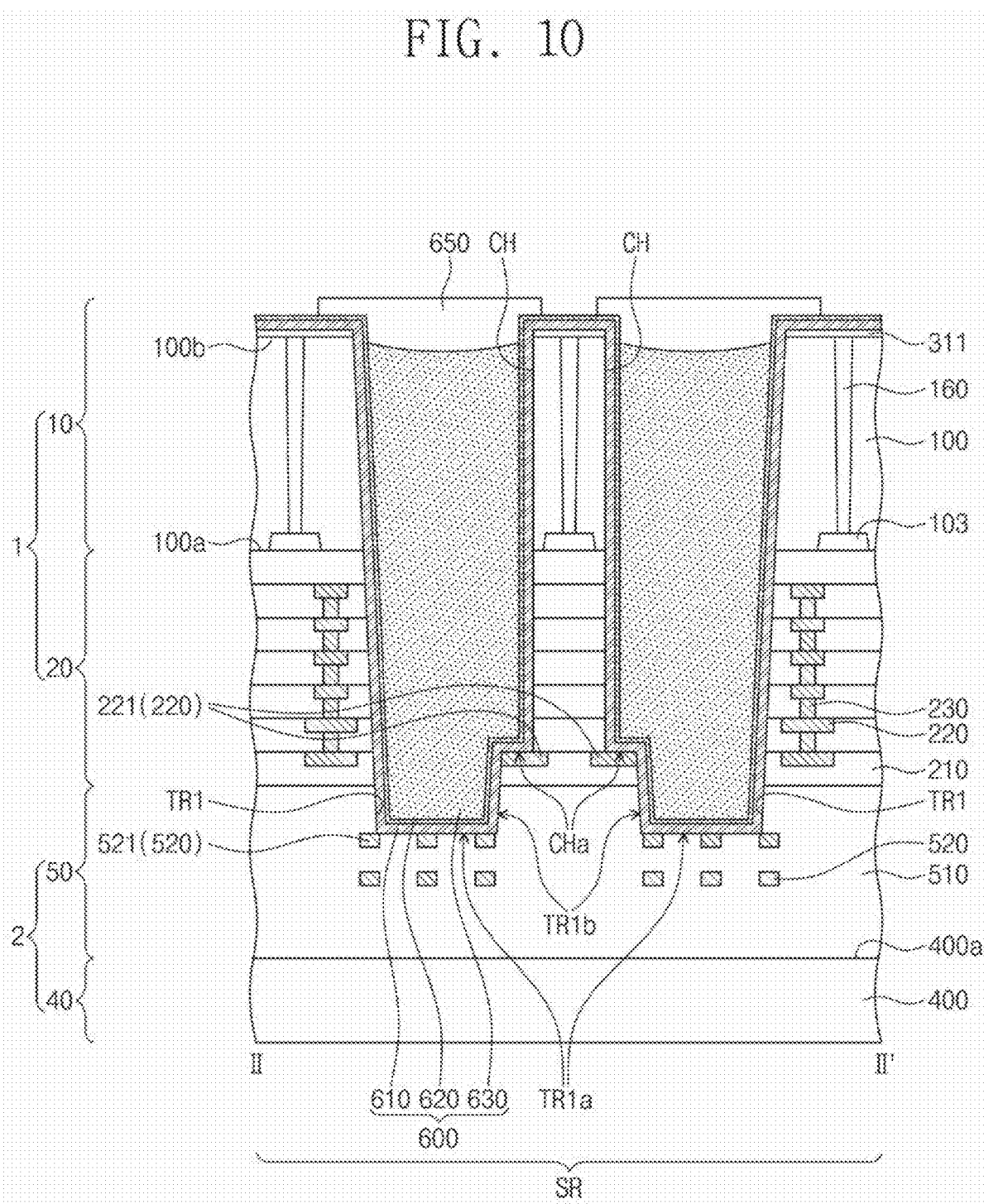
FIG. 10 is a cross-sectional view taken along a line II-II' of FIG. 9.

FIG. 9 is a plan view illustrating a stack region of an image sensor according to example embodiments. FIG. 10 is a cross-sectional view taken along a line II-II' of FIG. 9. Hereinafter, the descriptions to the same components and/or features as in the above example embodiments will be omitted for the purpose of ease and convenience in explanation.

Referring to FIGS. 9 and 10, two through-holes CH may be provided in the first substrate 100. Each of the through-holes CH may penetrate a portion of the second interconnection layer 50, the first substrate 100, and the first interconnection layer 20. Each of the through-holes CH may include a first trench TR1 extending from a bottom surface CHa of each of the through-holes CH toward the second interconnection layer 50. The bottom surface CHa of the through-hole CH may be located at a higher level than a bottom surface TR1a of the first trench TR1. The through-holes CH may be disposed to face each other and may be symmetrical with respect to an isolation pattern 160 disposed between the through-holes CH.

The bottom surface TR1a of each of the first trenches TR1 may be in contact with each of corresponding second interconnection patterns 521 of the second interconnection patterns 520. For example, the corresponding second interconnection patterns 521 may be uppermost ones of the second interconnection patterns 520. However, the corresponding second interconnection patterns 521 are not limited to the uppermost ones of the second interconnection patterns 520. For example, at least one second interconnection pattern may further be disposed on each of the corresponding second interconnection patterns 521.

The bottom surface CHa of each of the through-holes CH may be in contact with each of corresponding first interconnection patterns 221 of the first interconnection patterns 220. For example, the corresponding first interconnection patterns 221 may be lowermost ones of the first interconnection patterns 220. However, the corresponding first interconnection patterns 221 are not limited to the lowermost ones of the first interconnection patterns 220. For example, at least one first interconnection pattern being in contact with the outer sidewall TR1b of the first trench TR1 may further be disposed under each of the corresponding first interconnection patterns 221. In example embodiments, at least one first interconnection pattern disposed under each of the corresponding first interconnection patterns 221 may be a single first interconnection pattern. In example embodiments, at least one first interconnection pattern disposed under each of the corresponding first interconnection patterns 221 may include a plurality of stacked first interconnection patterns. The corresponding first interconnection patterns 221 may be disposed between the outer sidewalls TR1b of the first trenches TR1. The outer sidewalls TR1b of the first trenches TR1 may be adjacent to each other. For example, one sidewall of each of the corresponding first interconnection patterns 221 may be in contact with the outer sidewall TR1b of each of the first trenches TR1.

First connection structures 600 may be disposed on inner surfaces of the through-holes CH, respectively. Each of the first connection structures 600 may include a first conductive layer 610 conformally covering the inner surface of the through-hole CH, for example, an inner sidewall and the bottom surface CHa of the through-hole CH and an inner surface of the first trench TR1, a first protective insulating layer 620 disposed on the first conductive layer 610 to conformally cover the first conductive layer 610, and a first filling pattern 630 disposed on the first protective insulating layer 620 to fill a remaining portion of the through-hole CH. The first conductive layer 610 may be electrically connected to the first interconnection patterns 220 and the second interconnection patterns 520 to electrically connect the sensor chip 1 to the logic chip 2. For example, the sensor chip 1 and the logic chip 2 may be electrically connected to each other by the first connection structure 600.

Each of the corresponding first interconnection patterns 221 may have a shape including a first opening OP1 when viewed in a plan view. Each of the corresponding second interconnection patterns 521 may be disposed in each of the first openings OP1 when viewed in a plan view. Each of the corresponding second interconnection patterns 521 may have a shape including at least one second opening OP2. For example, each of the corresponding second interconnection patterns 521 may have a shape including four second openings OP2.

An isolation pattern 160 may be provided in the first substrate 100 and may be disposed on the shallow device isolation pattern 103. The isolation pattern 160 may be disposed at both sides of the through-holes CH and may extend between the through-holes CH. For example, the isolation pattern 160 may be provided adjacent to and surround each of the through-holes CH when viewed in a plan view. The isolation pattern 160 may have, for example, a quadrilateral or rectangular ring shape when viewed in a plan view.

Figure 11:
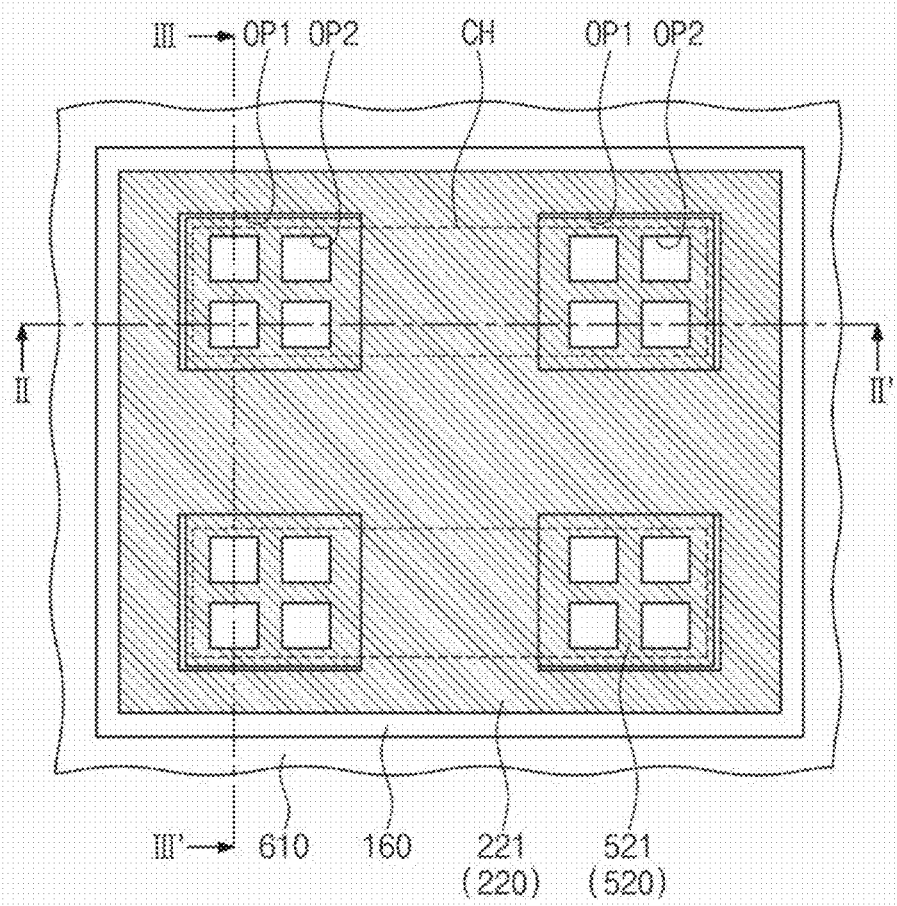
FIG. 11 is a plan view illustrating a stack region of an image sensor according to example embodiments.
Figure 12A:
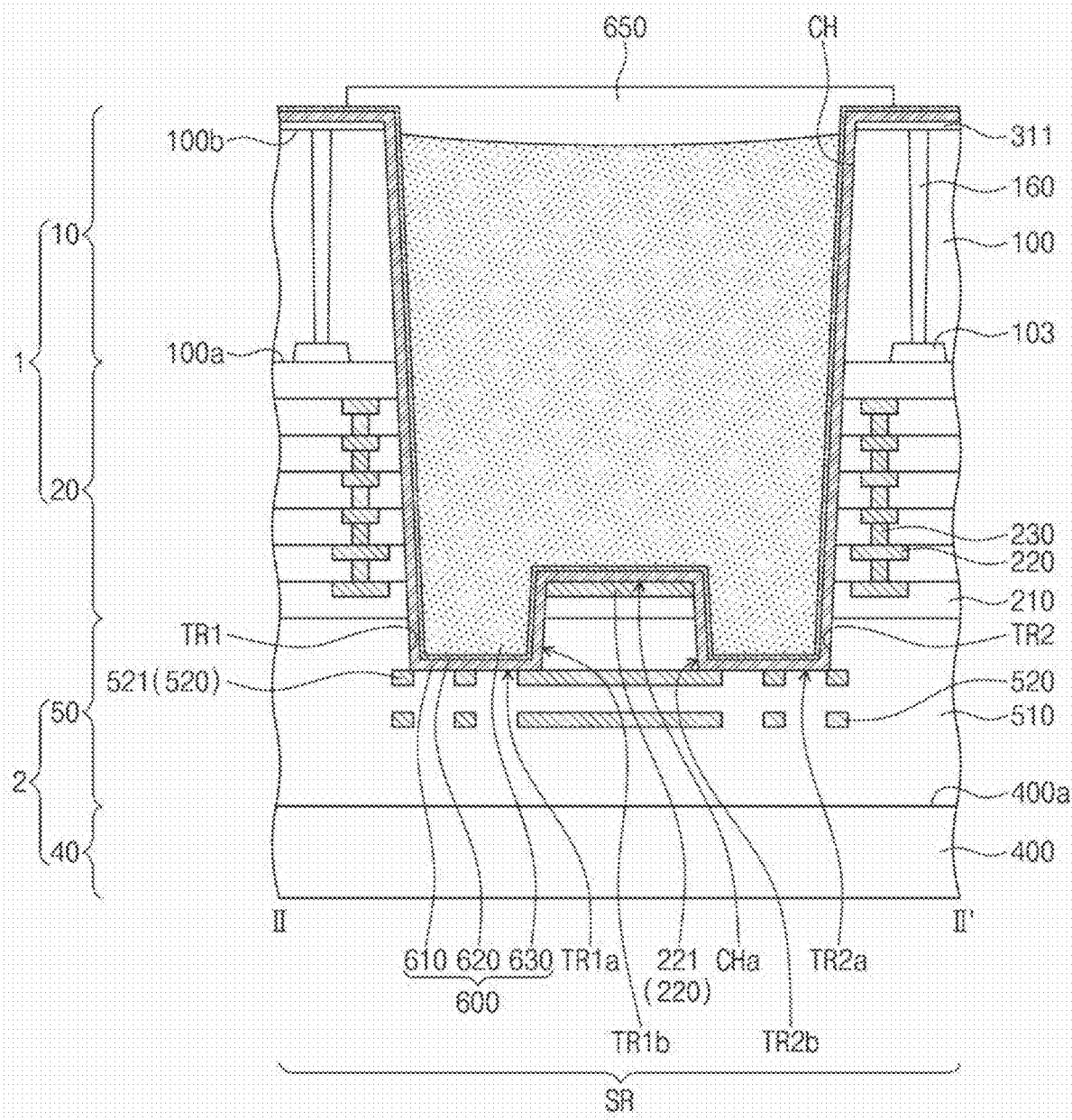
FIG. 12A is a cross-sectional view taken along a line II-II' of FIG. 11.
Figure 12B:
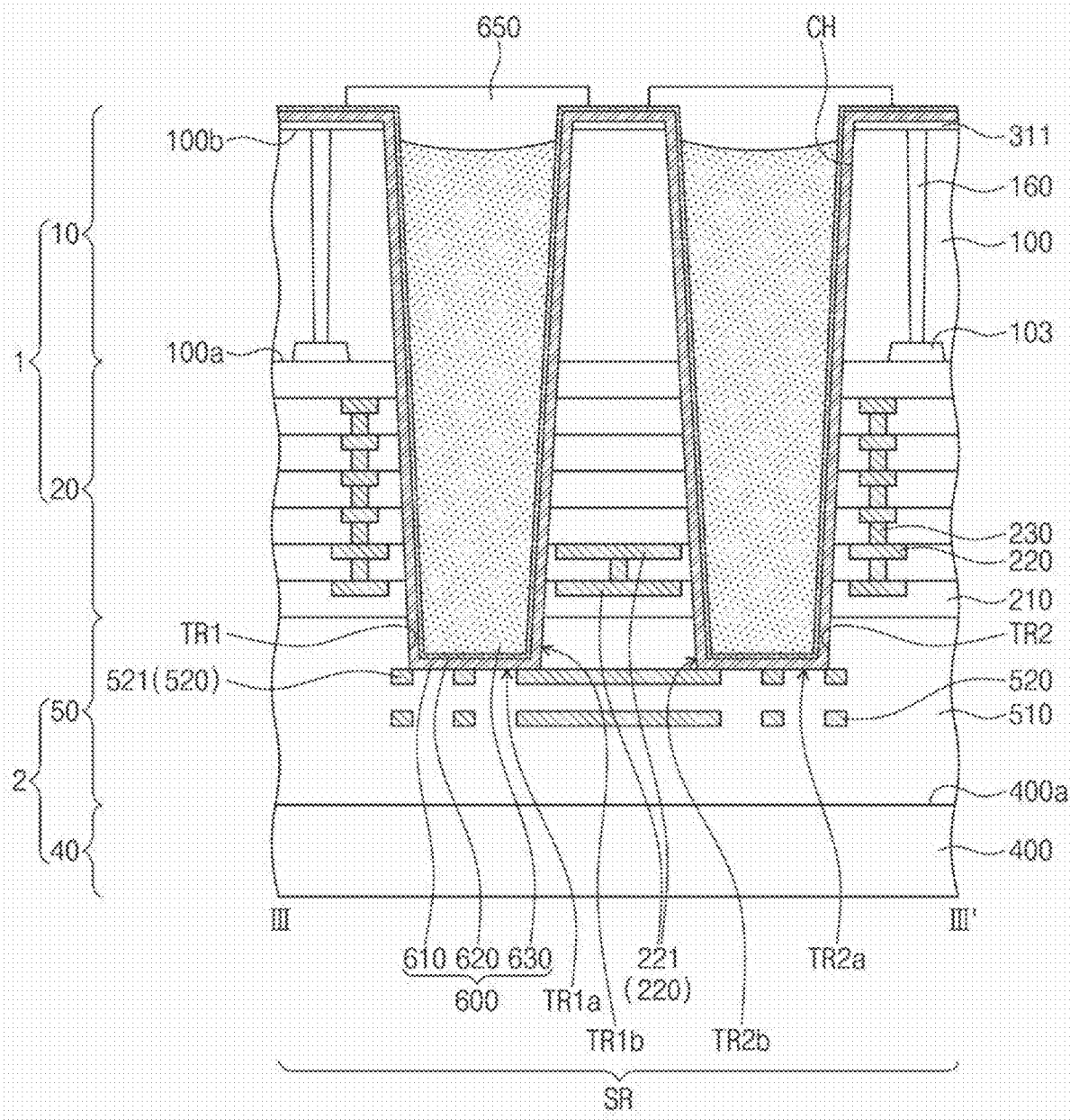
FIG. 12B is a cross-sectional view taken along a line III-III' of FIG. 11.

FIG. 11 is a plan view illustrating a stack region of an image sensor according to example embodiments. FIG. 12A is a cross-sectional view taken along a line II-II' of FIG. 11. FIG. 12B is a cross-sectional view taken along a line III-III' of FIG. 11. Hereinafter, the descriptions to the same features and components as mentioned above will be omitted for the purpose of ease and convenience in explanation.

Referring to FIGS. 11, 12A and 12B, two through-holes CH may be provided in the first substrate 100. Each of the through-holes CH may penetrate a portion of the second interconnection layer 50, the first substrate 100, and the first interconnection layer 20. Each of the through-holes CH may include a first trench TR1 and a second trench TR2, each of which extends from a bottom surface CHa of each of both end portions of the through-hole CH toward the second interconnection layer 50. Each of the through-holes CH may be substantially the same as described with reference to FIGS. 5 and 6A.

The corresponding first interconnection pattern 221 may have a shape including at least one first opening OP1 when viewed in a plan view. For example, the corresponding first interconnection pattern 221 may have a shape including four first openings OP1. Each of edge regions of the corresponding second interconnection pattern 521 may be disposed in each of the first openings OP1 when viewed in a plan view. The corresponding second interconnection pattern 521 may have a shape including at least one second opening OP2. For example, each of the edge regions of the corresponding second interconnection pattern 521 may have a shape including four second openings OP2.

Figure 13:
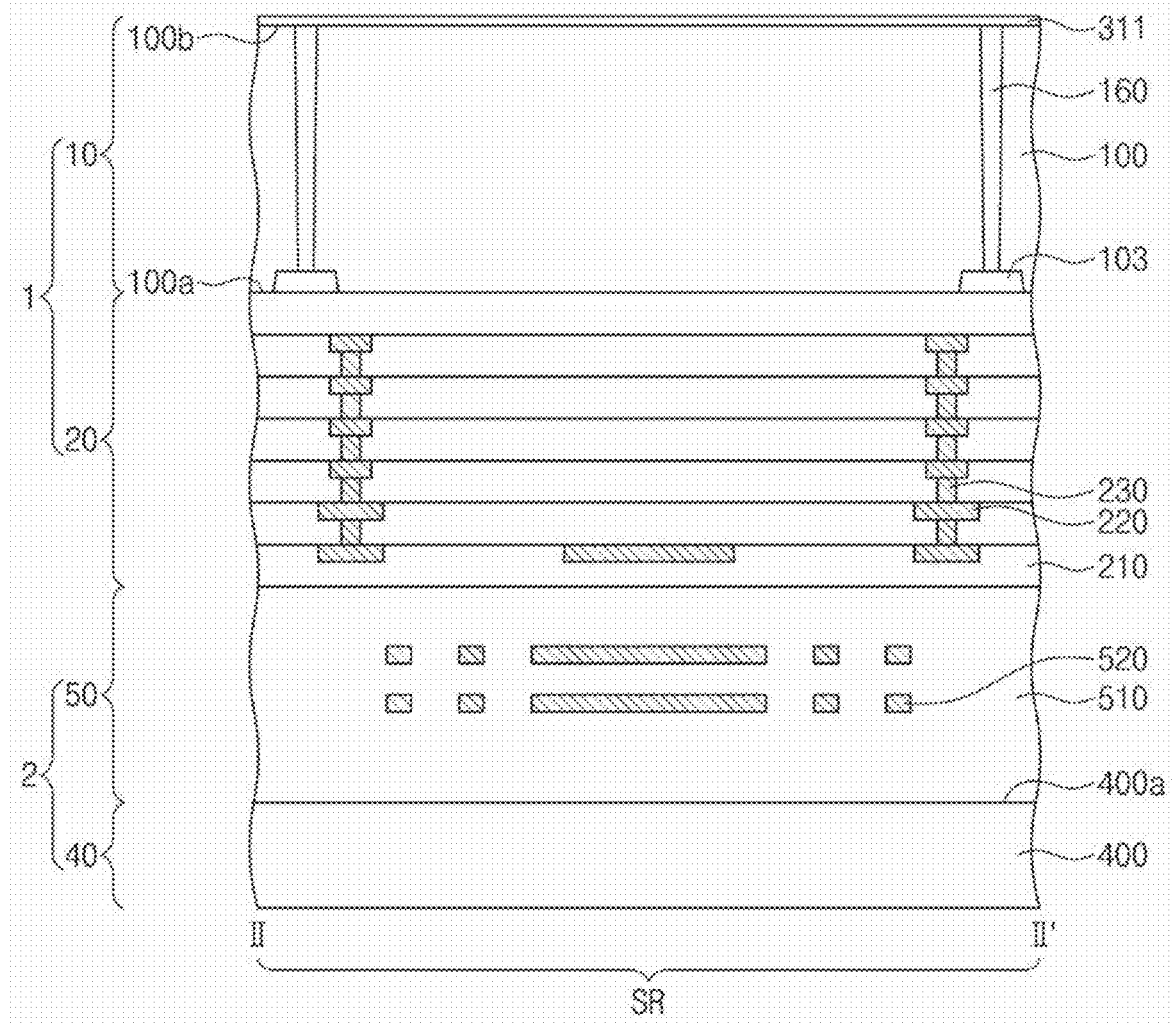
FIGS. 13, 14, and 15 are cross-sectional views corresponding to the line II-II' of FIG. 5 to illustrate a method of manufacturing an image sensor according to example embodiments.
Figure 14:
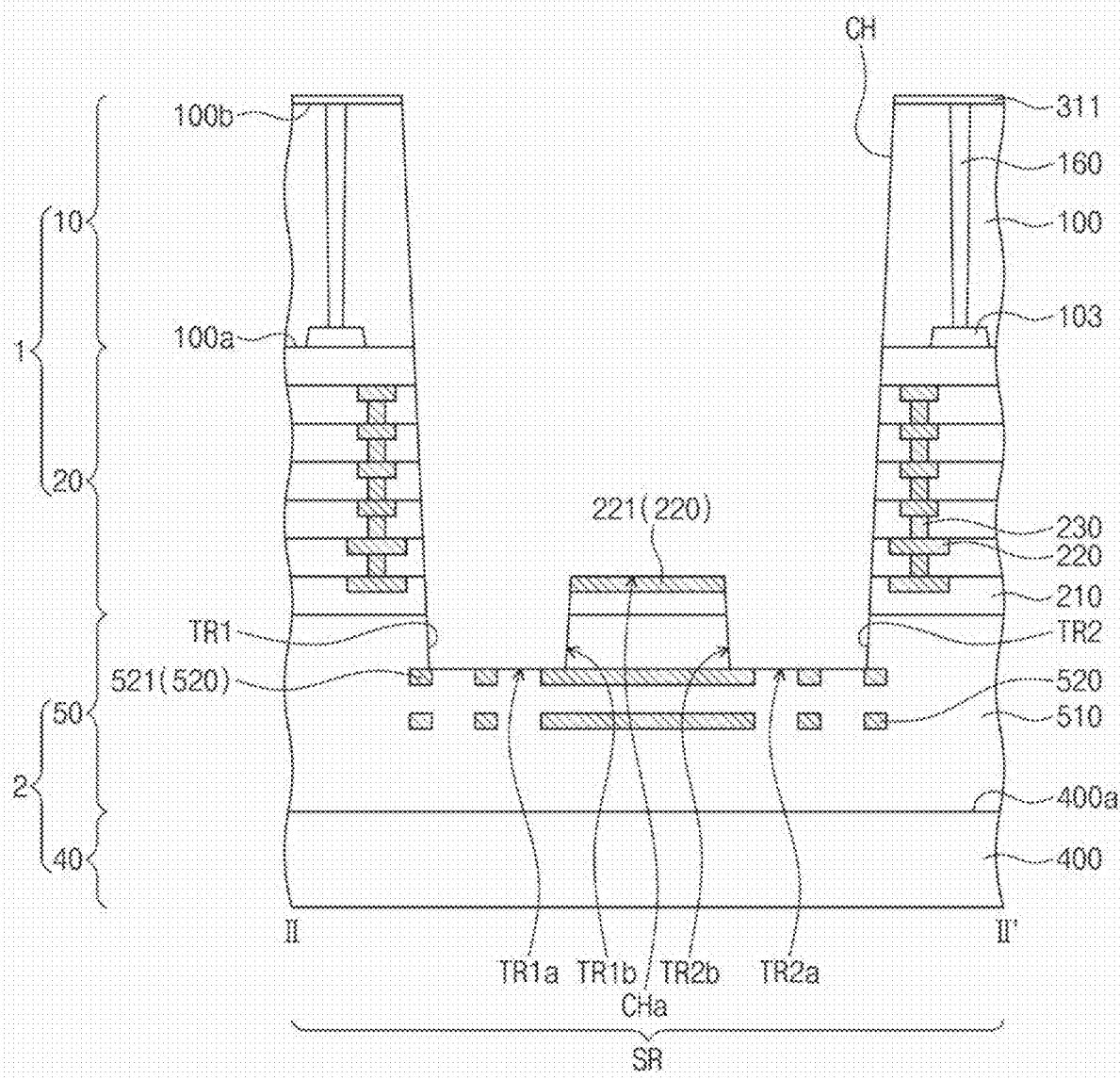
Figure 15:
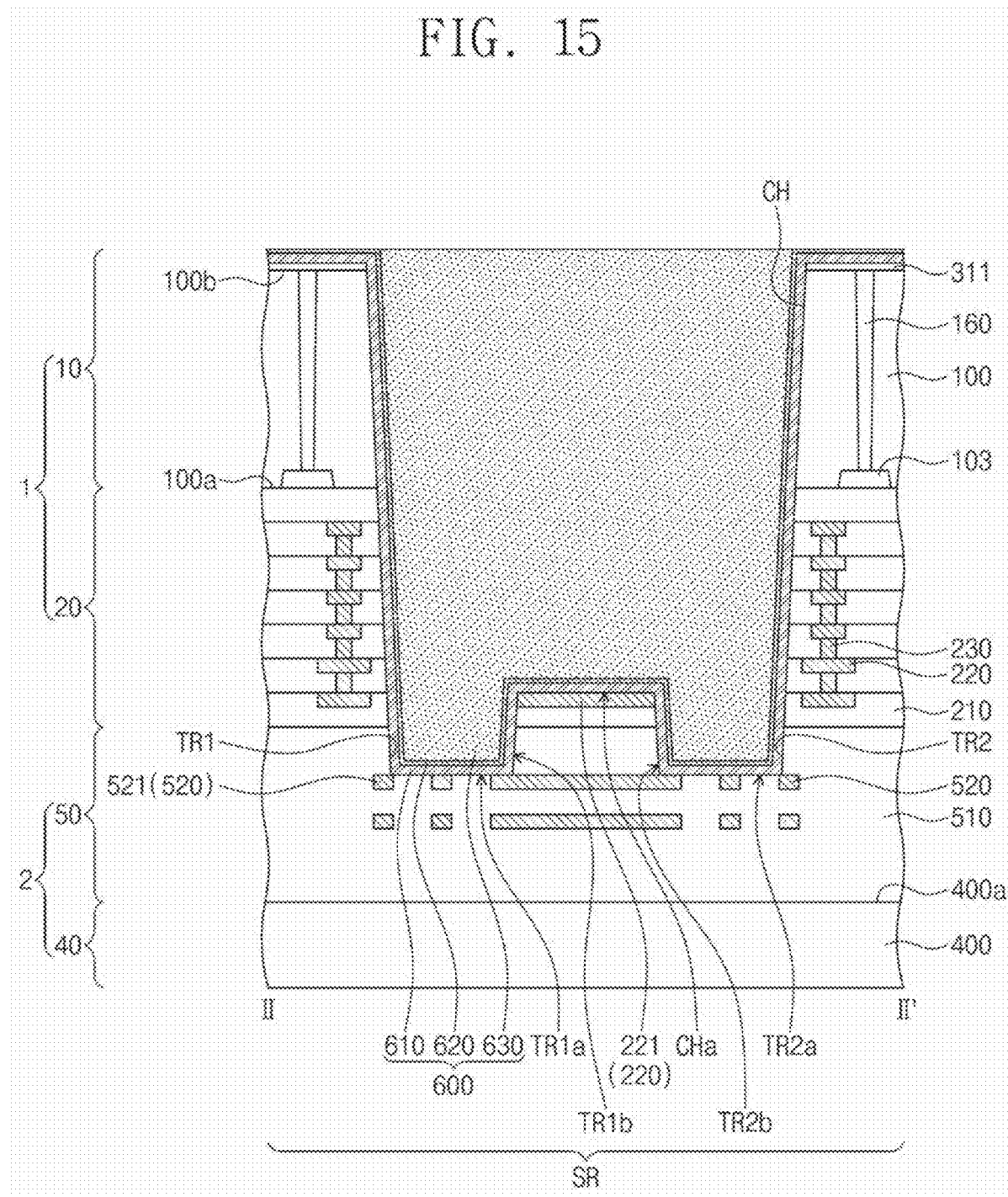

FIGS. 13 to 15 are cross-sectional views corresponding to the line II-II' of FIG. 5 to illustrate a method of manufacturing an image sensor according to example embodiments. Hereinafter, the descriptions to the same features as mentioned with reference to FIGS. 5 and 6A will be omitted for the purpose of ease and convenience in explanation.

Referring to FIG. 13, a logic chip 2 including a base substrate layer 40 and a second interconnection layer 50 may be provided. The base substrate layer 40 may include a second substrate 400. The second interconnection layer 50 may include second interlayer insulating layers 510 and second interconnection patterns 520. For example, a plurality of the second interlayer insulating layers 510 may be stacked on a top surface 400a of the second substrate 400. The second interconnection patterns 520 may be formed in the second interlayer insulating layers 510, respectively.

A sensor chip 1 including a first interconnection layer 20 and a photoelectric conversion layer 10 may be provided. For example, a first substrate 100 having first and second surfaces 100a and 100b opposite to each other may be provided. The first interconnection layer 20 may be formed on the first surface 100a of the first substrate 100. The first interconnection layer 20 may include first interlayer insulating layers 210 and first interconnection patterns 220. For example, a plurality of the first interlayer insulating layers 210 may be stacked on the first surface 100a of the first substrate 100. The first interconnection patterns 220 may be formed in the first interlayer insulating layers 210, respectively.

The sensor chip 1 may be stacked on the logic chip 2. For example, the sensor chip 1 may be stacked on an uppermost one of the second interlayer insulating layers 510. An upper insulating layer 311 may be formed on the second surface 100b of the first substrate 100.

Referring to FIG. 14, a through-hole CH may be formed by performing an etching process on the first substrate 100. The formation of the through-hole CH may include forming a photoresist pattern defining a region in which the through-hole CH will be formed, and etching the sensor chip 1 and a portion of the logic chip 2 by using the photoresist pattern as an etch mask. The first substrate 100, the first interlayer insulating layers 210 and a portion of the second interlayer insulating layers 510 may be selectively etched in the etching process. The etching process may be performed until a corresponding first interconnection pattern 221 of the first interconnection patterns 220 of the sensor chip 1 and a corresponding second interconnection pattern 521 of the second interconnection patterns 520 of the logic chip 2 are exposed. For example, the corresponding first interconnection pattern 221 and the corresponding second interconnection pattern 521 may not be etched during the etching process. For example, the corresponding second interconnection pattern 521 may be an uppermost one of the second interconnection patterns 520. However, embodiments are not limited thereto. For example, the corresponding first interconnection pattern 221 may be a lowermost one of the first interconnection patterns 220. For other examples, at least one first interconnection pattern may further be disposed under the corresponding first interconnection pattern 221.

Thus, the through-hole CH may include a first trench TR1 and a second trench TR2, each of which extends from a bottom surface CHa of each of both end portions of the through-hole CH toward the second interconnection layer 50. Particularly, the etching process may be performed in such a way that a bottom surface TR1*a* of the first trench TR1 and a bottom surface TR2*a* of the second trench TR2 are located at substantially the same level. In addition, the etching process may be performed in such a way that the bottom surface CHa of the through-hole CH between the first trench TR1 and the second trench TR2 is located at a higher level than the bottom surface TR1*a* of the first trench TR1 and the bottom surface TR2*a* of the second trench TR2.

Referring to FIG. 15, a first conductive layer 610 may be formed on an inner surface of the through-hole CH having the first and second trenches TR1 and TR2 to conformally cover the inner surface of the through-hole CH. A first protective insulating layer 620 may be formed on the first conductive layer 610 to conformally cover the first conductive layer 610. A first filling pattern 630 may be formed on the first protective insulating layer 620 to fill a remaining portion of the through-hole CH.

Referring again to FIGS. 5 and 6A, a portion of a top surface of the first filling pattern 630 may be etched. A first capping pattern 650 may be formed on the top surface of the first filling pattern 630.

Figure 16:
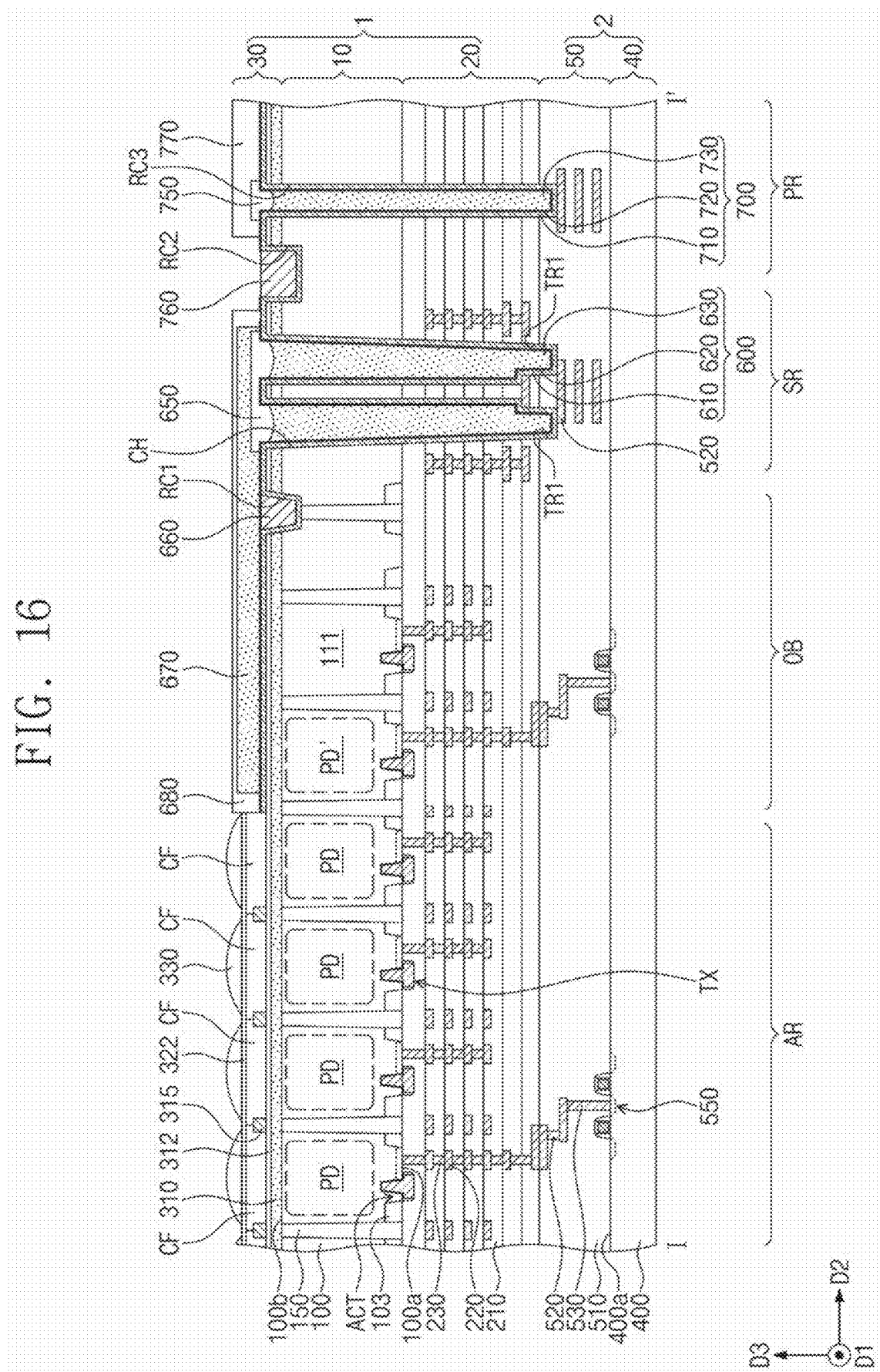
FIG. 16 is a cross-sectional view corresponding to the line I-I' of FIG. 3 to illustrate an image sensor according to example embodiments.

FIG. 16 is a cross-sectional view corresponding to the line I-I' of FIG. 3 to illustrate an image sensor according to example embodiments. Hereinafter, the descriptions to the same features as mentioned with reference to FIGS. 3, 4 and 7 to 10 will be omitted for the purpose of ease and convenience in explanation.

Referring to FIG. 16, an image sensor may include a sensor chip 1 and a logic chip 2. The sensor chip 1 and the logic chip 2 may be substantially the same as described above with reference to FIGS. 3 and 4. In addition, a through-hole CH and a first connection structure 600 may be substantially the same as described above with reference to FIGS. 7 to 10.

However, the sensor chip 1 may further include first interconnection patterns 220 exposed at a bottom surface of the sensor chip 1. The logic chip 2 may further include second interconnection patterns 520 exposed at a top surface of the logic chip 2. The first interconnection patterns 220 exposed at the bottom surface of the sensor chip 1 may be in contact with the second interconnection patterns 520 exposed at the top surface of the logic chip 2. Thus, the sensor chip 1 and the logic chip 2 may be connected to each other by a direct bonding method.

In example embodiments, a lowermost one of the first interlayer insulating layers 210 may be bonded directly to an uppermost one of the second interlayer insulating layers 510. In this case, chemical bonds may be formed between the lowermost first interlayer insulating layer 210 and the uppermost second interlayer insulating layer 510.

In the image sensor according to the example embodiments, the through-hole penetrating the sensor chip and a portion of the logic chip may include a plurality of trenches extending from the bottom surface of the through-hole toward the interconnection layer of the logic chip. Thus, a planar area of the connection structure connecting the logic chip and the sensor chip may be reduced, and connection failure between the logic chip and the sensor chip may be prevented. In addition, an upper width of the through-hole may be increased, and thus a manufacturing process may be facilitated.

In the image sensor according to the example embodiments, each of the through-holes penetrating the sensor chip and a portion of the logic chip may include the trench extending from the bottom surface of each of the through-holes toward the interconnection layer of the logic chip. Thus, connection failure between the logic chip and the sensor chip may be prevented.

While example embodiments have been illustrated and described above, it will be apparent to those skilled in the art that modifications and variations could be made without departing from the scope as defined by the appended claims and their equivalents.

What is claimed is:

1. An image sensor comprising:
  a sensor chip comprising a first substrate and a first interconnection layer, the first substrate including a first surface and a second surface opposite to the first surface, and the first interconnection layer being disposed on the first surface of the first substrate;
  a logic chip comprising a second substrate and a second interconnection layer, the second interconnection layer being disposed between the first interconnection layer and the second substrate;
  a through-hole penetrating a portion of the second interconnection layer, the first substrate, and the first interconnection layer; and
  a first connection structure disposed on an inner surface of the through-hole and extending from the first substrate toward the second interconnection layer,
  wherein the first interconnection layer comprises a first interlayer insulating layer and a first interconnection pattern disposed on the first interlayer insulating layer,
  wherein the second interconnection layer comprises a second interlayer insulating layer and a second interconnection pattern disposed on the second interlayer insulating layer,
  wherein the through-hole includes a first trench and a second trench, the first trench and the second trench respectively extending from a bottom surface of two end portions of the through-hole toward the second interconnection layer,
  wherein a bottom surface of the first trench and a bottom surface of the second trench are in contact with the second interconnection pattern,
  wherein a bottom surface of the through-hole between the first trench and the second trench is in contact with the first interconnection pattern,
  wherein the first interconnection pattern includes at least one first opening in a plan view, and
  wherein a portion of the second interconnection pattern is disposed on the at least one first opening in the plan view and includes at least one second opening in the plan view.

2. The image sensor of claim 1, wherein the bottom surface of the first trench and the bottom surface of the second trench are disposed at substantially a same level in a vertical direction, and
wherein the bottom surface of the through-hole is disposed at a higher level in the vertical direction than the bottom surface of the first trench.

3. The image sensor of claim 1, wherein the first connection structure comprises:
a first conductive layer disposed on the inner surface of the through-hole;
a first protective insulating layer disposed on the first conductive layer; and
a first filling pattern disposed on the first protective insulating layer to fill a remaining portion of the through-hole.

4. The image sensor of claim 3, wherein the first conductive layer is electrically connected to the first interconnection pattern and the second interconnection pattern to electrically connect the sensor chip to the logic chip.

5. The image sensor of claim 1, further comprising:
a first capping pattern disposed on an upper surface of the first connection structure,
wherein a bottom surface of the first capping pattern is convex downward toward the first surface of the first substrate.

6. The image sensor of claim 1, wherein the first interlayer insulating layer comprises a plurality of first interlayer insulating layers,
wherein the first interconnection pattern comprises a plurality of first interconnection patterns, and the plurality of first interconnection patterns are disposed on the plurality of first interlayer insulating layers, respectively,
wherein the second interlayer insulating layer comprises a plurality of second interlayer insulating layers,
wherein the second interconnection pattern comprises a plurality of second interconnection patterns, and the plurality of second interconnection patterns are disposed on the plurality of second interlayer insulating layers, respectively,
wherein a second interconnection pattern among the plurality of second interconnection patterns being in contact with the bottom surface of the first trench and the bottom surface of the second trench is an uppermost one of the plurality of second interconnection patterns, and
wherein a first interconnection pattern among the plurality of first interconnection patterns being in contact with the bottom surface of the through-hole is a lowermost one of the plurality of first interconnection patterns.

7. The image sensor of claim 1, wherein the first interlayer insulating layer comprises a plurality of first interlayer insulating layers,
wherein the first interconnection pattern comprises a plurality of first interconnection patterns, and the plurality of first interconnection patterns are disposed on the plurality of first interlayer insulating layers, respectively,
wherein the second interlayer insulating layer comprises a plurality of second interlayer insulating layers,
wherein the second interconnection pattern comprises a plurality second interconnection patterns, and the plurality of second interconnection patterns are disposed on the plurality of second interlayer insulating layers, respectively,
wherein a second interconnection pattern among the plurality of second interconnection patterns being in contact with the bottom surface of the first trench and the bottom surface of the second trench is an uppermost one of the plurality of second interconnection patterns, and
wherein the plurality of first interconnection patterns comprise at least one first interconnection pattern which is disposed under a first interconnection pattern among the plurality of first interconnection patterns being in contact with the bottom surface of the through-hole and is in contact with an outer sidewall of the first trench and an outer sidewall of the second trench.

8. The image sensor of claim 1, wherein the first connection structure electrically connects the sensor chip and the logic chip to each other.

9. The image sensor of claim 1, further comprising:
an isolation pattern disposed in the first substrate and disposed at both sides of the through-hole,
wherein the isolation pattern has a quadrilateral shape or rectangular ring shape when viewed in a plan view.

10. The image sensor of claim 1, further comprising:
a second connection structure penetrating a portion of the second interconnection layer, the first substrate, and the first interconnection layer,
wherein the second connection structure is spaced apart from the first connection structure in a direction parallel to the first surface of the first substrate, and
wherein the second connection structure is electrically connected to the second interconnection layer.

11. The image sensor of claim 10, further comprising:
a pad contact disposed on the second surface of the first substrate and disposed between the first connection structure and the second connection structure.

12. An image sensor comprising:
a sensor chip comprising a first substrate and a first interconnection layer, the first substrate including a first surface and a second surface opposite to the first surface, and the first interconnection layer being disposed on the first surface of the first substrate;
a logic chip comprising a second substrate and a second interconnection layer, the second interconnection layer disposed between the first interconnection layer and the second substrate;
a through-hole penetrating a portion of the second interconnection layer, the first substrate, and the first interconnection layer; and
a first connection structure disposed on an inner surface of the through-hole and extending from the first substrate toward the second interconnection layer,
wherein the first interconnection layer comprises a first interlayer insulating layer and a first interconnection pattern disposed on the first interlayer insulating layer,
wherein the second interconnection layer comprises a second interlayer insulating layer and a second interconnection pattern disposed on the second interlayer insulating layer,
wherein the through-hole includes a first trench and a second trench which respectively extend from a bottom surface of the through-hole toward the second interconnection layer,
wherein a bottom surface of the first trench and a bottom surface of the second trench are disposed at substantially a same level,
wherein the bottom surface of the through-hole between the first trench and the second trench is disposed at a higher level than the bottom surface of the first trench, wherein the bottom surface of the first trench and the bottom surface of the second trench are in contact with the second interconnection pattern, wherein the first interconnection pattern is disposed between an outer sidewall of the first trench and an outer sidewall of the second trench, wherein the first interconnection pattern includes at least one first opening in a plan view, and wherein a portion of the second interconnection pattern is disposed on the at least one first opening in the plan view and includes at least one second opening in the plan view.

13. The image sensor of claim 12, wherein the bottom surface of the through-hole between the first trench and the second trench is in contact with the first interconnection pattern.

14. The image sensor of claim 12, further comprising:
a first capping pattern disposed on the first connection structure,
wherein the first connection structure comprises:
a first conductive layer disposed on the inner surface of the through-hole;
a first protective insulating layer disposed on the first conductive layer; and
a first filling pattern disposed on the first protective insulating layer to fill a remaining portion of the through-hole.

15. An image sensor comprising:
a sensor chip comprising a first substrate and a first interconnection layer, the first substrate including a first surface and a second surface opposite to the first surface, and the first interconnection layer being disposed on the first surface of the first substrate;
a logic chip comprising a second substrate and a second interconnection layer, the second interconnection layer disposed between the first interconnection layer and the second substrate;
two through-holes penetrating a portion of the second interconnection layer, the first substrate, and the first interconnection layer, the two through-holes facing each other;
first connection structures disposed on inner surfaces of the two through-holes, respectively, and extending from the first substrate toward the second interconnection layer; and
first capping patterns disposed on the first connection structures, respectively,
wherein the first interconnection layer comprises a first interlayer insulating layer and a first interconnection pattern disposed on the first interlayer insulating layer,
wherein the second interconnection layer comprises a second interlayer insulating layer and second interconnection patterns disposed on the second interlayer insulating layer,
wherein each of the two through-holes includes a first trench extending from a bottom surface of each of the two through-holes toward the second interconnection layer,
wherein a bottom surface of the first trench is in contact with a corresponding second interconnection pattern among the second interconnection patterns,
wherein the bottom surface of each of the two through-holes is in contact with the first interconnection pattern,
wherein each of the first connection structures comprises:
a first conductive layer disposed on an inner surface of each of the two through-holes;
a first protective insulating layer disposed on the first conductive layer; and
a first filling pattern disposed on the first protective insulating layer to fill a remaining portion of each of the two through-holes,
wherein the first interconnection pattern includes at least one first opening in a plan view, and
wherein the second interconnection pattern is disposed on the at least one first opening in the plan view and includes at least one second opening in the plan view.

16. The image sensor of claim 15, wherein a bottom surface of a first capping pattern is convex downward toward the first surface of the first substrate.

17. The image sensor of claim 15, further comprising:
an isolation pattern disposed in the first substrate and disposed at a side of each of the two through-holes,
wherein the isolation pattern is disposed adjacent to the two through-holes when viewed in a plan view, and
wherein the isolation pattern has a quadrilateral shape or rectangular ring shape when viewed in the plan view.

18. The image sensor of claim 17, wherein the isolation pattern extends between the two through-holes.

* * * * *